US012796575B2

(12) United States Patent
Song et al.

(10) Patent No.: US 12,796,575 B2
(45) Date of Patent: Nov. 10, 2026

(54) PACKAGE COMPRISING DUMMY SILICON STRUCTURE LOCATED BETWEEN INTEGRATED DEVICES

(71) Applicant: QUALCOMM Incorporated, San Diego, CA (US)

(72) Inventors: Yanmei Song, San Diego, CA (US); William Stone, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 19/378,139

(22) Filed: Nov. 3, 2025

(65) Prior Publication Data

US 2026/0068780 A1 Mar. 5, 2026

Related U.S. Application Data

(63) Continuation of application No. 18/748,011, filed on Jun. 19, 2024.

(51) Int. Cl.
*H10W 90/00* (2026.01)
*H10W 20/41* (2026.01)
(Continued)

(52) U.S. Cl.
CPC ....... *H10W 90/701* (2026.01); *H10W 20/435* (2026.01); *H10W 70/60* (2026.01); *H10W 70/614* (2026.01); *H10W 70/635* (2026.01); *H10W 70/685* (2026.01); *H10W 72/072* (2026.01); *H10W 72/20* (2026.01); *H10W 72/247* (2026.01); *H10W 72/9413* (2026.01);
(Continued)

(58) Field of Classification Search
CPC . H10W 90/701; H10W 90/724; H10W 70/60; H10W 70/635; H10W 70/614; H10W 74/131; H10W 74/117; H10W 70/685; H10W 72/072; H10W 72/20; H10W 20/435; H10W 74/00; H10W 72/9413; H10W 72/247; H10W 74/114
See application file for complete search history.

(56) References Cited

U.S. PATENT DOCUMENTS 9,312,193 B2 4/2016 Chen
10,879,183 B2 * 12/2020 Wang ...................... H10P 72/74
(Continued)

OTHER PUBLICATIONS

International Search Report and Written Opinion—PCT/US2025/033541—ISA/EPO—Oct. 15, 2025.

*Primary Examiner* — Alonzo Chambliss
(74) *Attorney, Agent, or Firm* — Loza & Loza, LLP

(57) ABSTRACT

A package comprising a first metallization portion; a second metallization portion; a first passive device coupled to the second metallization portion; a first encapsulation layer located between the first metallization portion and the second metallization portion; a first integrated device coupled to the first metallization portion; a second integrated device coupled to the first metallization portion; a dummy silicon structure located laterally between the first integrated device and the second integrated device; and a second encapsulation layer coupled to the first metallization portion, wherein the second encapsulation layer at least partially encapsulates the first integrated device, the second integrated device and the dummy silicon structure.

19 Claims, 21 Drawing Sheets

CROSS SECTIONAL PROFILE VIEW

(51) Int. Cl.

| | |
|---|---|
| ***H10W 70/60*** | (2026.01) |
| ***H10W 70/63*** | (2026.01) |
| ***H10W 70/685*** | (2026.01) |
| ***H10W 72/00*** | (2026.01) |
| ***H10W 72/20*** | (2026.01) |
| ***H10W 72/90*** | (2026.01) |
| ***H10W 74/10*** | (2026.01) |

(52) U.S. Cl.
CPC ........ *H10W 74/114* (2026.01); *H10W 74/117* (2026.01); *H10W 74/131* (2026.01); *H10W 90/724* (2026.01)

(56) References Cited

U.S. PATENT DOCUMENTS

| | | | | |
|---|---|---|---|---|
| 11,462,463 | B2 | 10/2022 | Elsherbini et al. | |
| 11,710,693 | B2 * | 7/2023 | Shih | H10P 72/74 257/668 |
| 11,916,002 | B2 * | 2/2024 | Kang | H10W 70/685 |
| 12,002,737 | B2 * | 6/2024 | Su | H10P 72/74 |
| 2016/0322330 | A1 | 11/2016 | Lin et al. | |
| 2017/0062383 | A1 | 3/2017 | Yee et al. | |
| 2018/0005984 | A1 | 1/2018 | Yu et al. | |
| 2018/0025992 | A1 | 1/2018 | Hung et al. | |
| 2018/0053730 | A1 | 2/2018 | Shao et al. | |
| 2018/0358298 | A1 | 12/2018 | Zhai et al. | |
| 2018/0366436 | A1 | 12/2018 | Wang et al. | |
| 2019/0096825 | A1 | 3/2019 | Kim et al. | |
| 2019/0109119 | A1 | 4/2019 | Shih et al. | |
| 2019/0333845 | A1 | 10/2019 | Chen | |
| 2019/0393153 | A1 | 12/2019 | Wang et al. | |
| 2020/0043893 | A1 | 2/2020 | Chen et al. | |
| 2020/0266156 | A1 | 8/2020 | Lee | |
| 2021/0111166 | A1 | 4/2021 | Zhang et al. | |
| 2021/0159180 | A1 | 5/2021 | Zhai et al. | |
| 2021/0280540 | A1 | 9/2021 | Kim et al. | |
| 2021/0351145 | A1 | 11/2021 | Patil et al. | |
| 2022/0157777 | A1 | 5/2022 | Yang et al. | |
| 2022/0223543 | A1 | 7/2022 | Choi et al. | |
| 2022/0384390 | A1 | 12/2022 | Yang et al. | |
| 2023/0040467 | A1 | 2/2023 | Chen et al. | |
| 2023/0082912 | A1 | 3/2023 | Chang et al. | |
| 2023/0092361 | A1 | 3/2023 | Wu et al. | |
| 2023/0352352 | A1 | 11/2023 | Yu et al. | |
| 2024/0030065 | A1 * | 1/2024 | Duan | H05K 1/111 |
| 2024/0038648 | A1 | 2/2024 | Chen et al. | |
| 2024/0063148 | A1 | 2/2024 | Foo et al. | |
| 2024/0071993 | A1 | 2/2024 | Song et al. | |
| 2024/0072032 | A1 | 2/2024 | Song et al. | |
| 2024/0105688 | A1 | 3/2024 | Li et al. | |
| 2025/0391755 | A1 | 12/2025 | Song et al. | |

* cited by examiner

CROSS SECTIONAL PROFILE VIEW

CROSS SECTIONAL PROFILE VIEW

CROSS SECTIONAL PROFILE VIEW

CROSS SECTIONAL PROFILE VIEW

PLAN VIEW

PACKAGE COMPRISING DUMMY SILICON STRUCTURE LOCATED BETWEEN INTEGRATED DEVICES

CROSS-REFERENCE TO RELATED APPLICATION

This application is a continuation application of U.S. Non-Provisional application Ser. No. 18/748,011, filed in the United States Patent and Trademark Office on Jun. 19, 2024. This application claims priority to and the benefit of U.S. Non-Provisional application Ser. No. 18/748,011, the entire content of which is incorporated herein by reference as if fully set forth below in its entirety and for all applicable purposes.

FIELD

Various features relate to packages with trench capacitor devices.

BACKGROUND

A package may include a substrate, an interposer and/or integrated devices. These components are coupled together to provide a package that may perform various electrical functions. There is an ongoing need to provide better performing packages and/or more reliable and robust packages.

SUMMARY

Various features relate to packages with trench capacitor devices.

One example provides a package comprising a package interposer, a first integrated device coupled to the package interposer, a second integrated device coupled to the package interposer, a dummy silicon structure located laterally between the first integrated device and the second integrated device, and a second encapsulation layer coupled to the package interposer, wherein the encapsulation layer at least partially encapsulates the first integrated device, the second integrated device and the dummy silicon structure. The package interposer comprises a first metallization portion; a second metallization portion; a first passive device located between the first metallization portion and the second metallization portion; and a first encapsulation layer located between the first metallization portion and the second metallization portion.

Another example provides a package comprising a substrate; a first integrated device coupled to the substrate; a second integrated device coupled to the substrate; a dummy silicon structure located laterally between the first integrated device and the second integrated device; and an encapsulation layer coupled to the substrate, wherein the encapsulation layer at least partially encapsulates the first integrated device, the second integrated device and the dummy silicon structure.

Another example provides a package comprising a metallization portion; a first integrated device coupled to the metallization portion; a second integrated device coupled to the metallization portion; a dummy silicon structure located laterally between the first integrated device and the second integrated device; and an encapsulation layer coupled to the metallization portion, wherein the encapsulation layer at least partially encapsulates the first integrated device, the second integrated device and the dummy silicon structure.

BRIEF DESCRIPTION OF THE DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown as block diagrams in order to avoid obscuring the aspects in unnecessary detail. In other instances, well-known circuits, structures and techniques may not be shown in detail in order not to obscure the aspects of the disclosure.

The present disclosure describes a package comprising a package interposer, a first integrated device coupled to the package interposer, a second integrated device coupled to the package interposer, a dummy silicon structure located laterally between the first integrated device and the second integrated device, and a second encapsulation layer coupled to the package interposer, wherein the encapsulation layer at least partially encapsulates the first integrated device, the second integrated device and the dummy silicon structure. The package interposer comprises a first metallization portion; a second metallization portion; a first passive device located between the first metallization portion and the second metallization portion; and a first encapsulation layer located between the first metallization portion and the second metallization portion. The use of a dummy silicon structure helps reduce warpage of the package and helps improve the reliability of joints and/or connections between components of the package.

Exemplary Package Comprising a Dummy Silicon Structure

Figure 1:
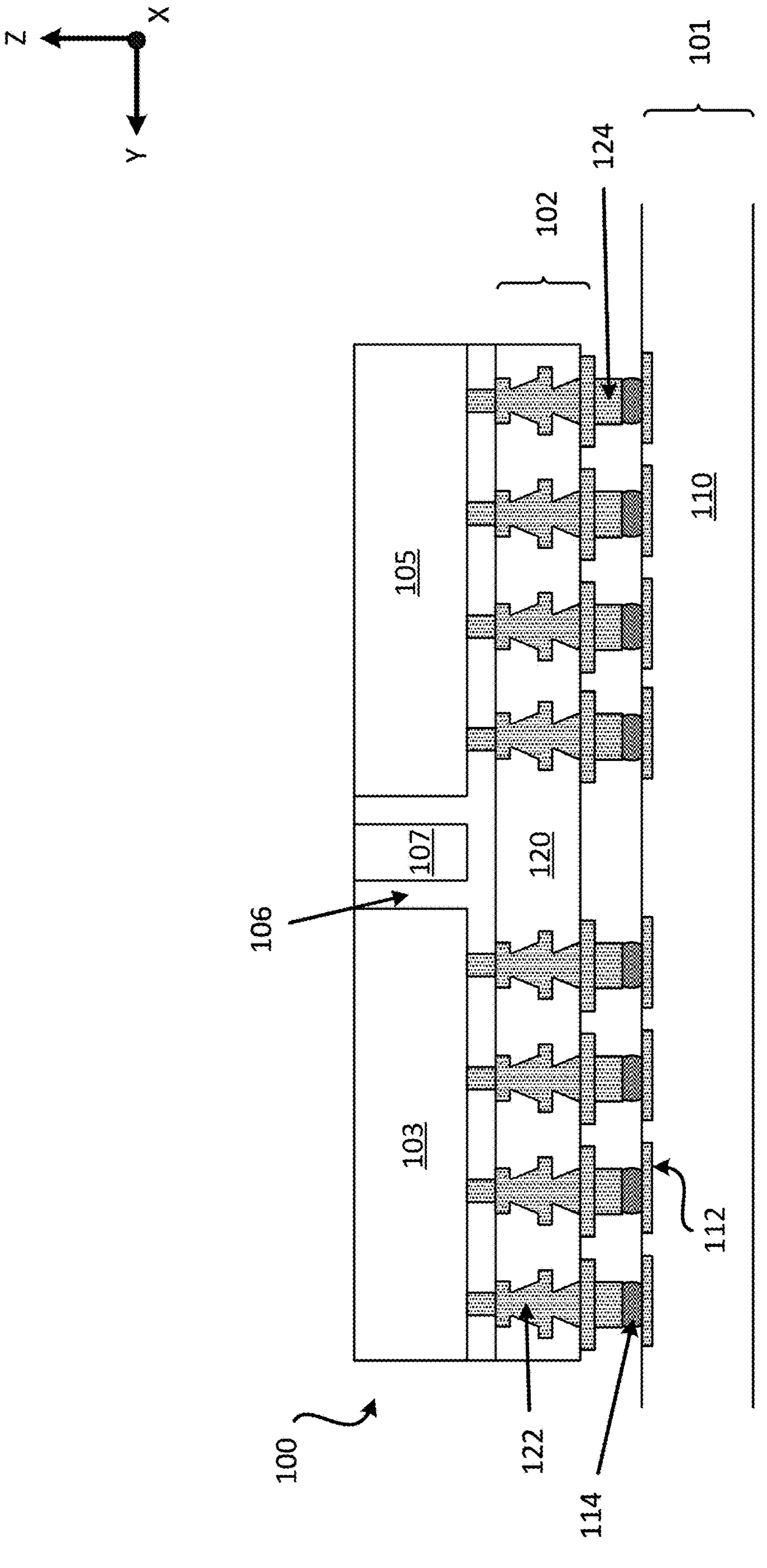
FIG. 1 illustrates an exemplary cross sectional profile view of a package comprising a dummy silicon structure.

FIG. 1 illustrates a cross sectional profile view of a package 100 that includes a dummy silicon structure. The package 100 is coupled to a board 101 through a plurality of solder interconnects 114. The board 101 includes at least one board dielectric layer 110 and a plurality of board interconnects 112. The board 101 may include a printed circuit board (PCB). In some implementations, the package 100 may be coupled to a substrate.

The package 100 includes a metallization portion 102, an integrated device 103, an integrated device 105, a dummy silicon structure 107 and an encapsulation layer 106. The metallization portion 102 includes at least one dielectric layer 120 and a plurality of metallization interconnects 122. A plurality of pillar interconnects 124 may be coupled to the plurality of metallization interconnects 122. The plurality of pillar interconnects 124 may considered part of the metallization portion 102. The plurality of solder interconnects 114 may be coupled to the plurality of pillar interconnects 124 and the plurality of board interconnects 112.

The integrated device 103 may be a first integrated device. The integrated device 105 may be a second integrated device. The integrated device 103 is coupled to the metallization portion 102. The metallization portion 102 may be coupled to pad interconnects and/or pillar interconnects of the integrated device 103. For example, the plurality of metallization interconnects 122 may be coupled to and touch pad interconnects and/or pillar interconnects of the integrated device 103. The integrated device 105 is coupled to the metallization portion 102. The metallization portion 102 may be coupled to pad interconnects and/or pillar interconnects of the integrated device 105. For example, the plurality of metallization interconnects 122 may be coupled to and touch pad interconnects and/or pillar interconnects of the integrated device 105.

The encapsulation layer 106 is coupled to a surface of the metallization portion 102. The encapsulation layer 106 may at least partially encapsulate the integrated device 103, the integrated device 105 and the dummy silicon structure 107. Thus, the integrated device 103, the integrated device 105 and the dummy silicon structure 107 may be located at least partially in the encapsulation layer 106. The encapsulation layer 106 may include a mold, a resin, an epoxy and/or a filler.

The dummy silicon structure 107 may include a dummy silicon component and/or dummy silicon block. The dummy silicon structure 107 may be free of transistors, passive devices and/or logic cells. The dummy silicon structure 107 may be free of any electrical connection with the integrated device 103 and/or the integrated device 105. For example, the dummy silicon structure 107 may be free of any electrical connection with transistors and/or logic cells of the integrated device 103 and/or transistors and/or logic cells of the integrated device 105. The dummy silicon structure 107 may be free of any electrical connection with circuits of the integrated device 103 and/or circuits of the integrated device 105. The dummy silicon structure 107 may be located laterally between the integrated device 103 and the integrated device 105. The thickness and/or the height of the dummy silicon structure 107 may vary with different implementations. In some implementations, the dummy silicon structure 107 may touch the metallization portion 102. In some implementations, the dummy silicon structure 107 may extend through part of the height and/or vertical thickness of the encapsulation layer 106 or through the entire height and/or vertical thickness of the encapsulation layer 106. In some implementations, the dummy silicon structure 107 may be located laterally to (i) the die substrate of the integrated device 103 and/or (ii) the die substrate of the integrated device 105. The dummy silicon structure 107 may be located adjacent to (i) an edge of the integrated device 103 comprising a die to die portion, and (ii) an edge of the integrated device 105 comprising a die to die portion. The dummy silicon structure 107 may represent one or more dummy silicon structures that are located between the integrated device 103 and the integrated device 105. Thus, in some implementations, a plurality of dummy silicon structures may be located in the encapsulation layer 106, and located between the integrated device 103 and the integrated device 105. In some implementations, one or more dummy silicon structures may be located in other locations of the package 100.

The metallization portion 102 may include a redistribution portion. The plurality of metallization interconnects 122 may include a plurality of redistribution interconnects. A redistribution interconnect may include portions that have a U-shape or V-shape. The terms "U-shape" and" V-shape" shall be interchangeable. The terms "U-shape" and "V-shape" may refer to the side profile shape of the interconnects, metallization interconnects and/or redistribution interconnects. The U-shape interconnect (e.g., U-shape side profile interconnect) and the V-shape interconnect (e.g., V-shape side profile interconnect) may have a top portion and a bottom portion. A bottom portion of a U-shape interconnect (or a V-shape interconnect) may be coupled to a top portion of another U-shape interconnect (or a V-shape interconnect). In some implementations, a process for fabricating redistribution interconnects may form the U-shape interconnect (or the V-shape interconnect). The above description of a metallization portion may apply to other metallization portions described in the disclosure.

The use of at least one dummy silicon structure helps provides a more reliable package that is subject to less warpage. The silicon material of the dummy silicon structure 107 may be identical or closely matches to the material of the die substrate of the integrated device 103 and/or the material of the die substrate of the integrated device 105, which helps improve and/or minimize warpage of the package 100. Less warpage of the package may mean the less likelihood of cracking of joints and/or may mean more reliable joints and/or connections between different components of the package 100.

Figure 2:
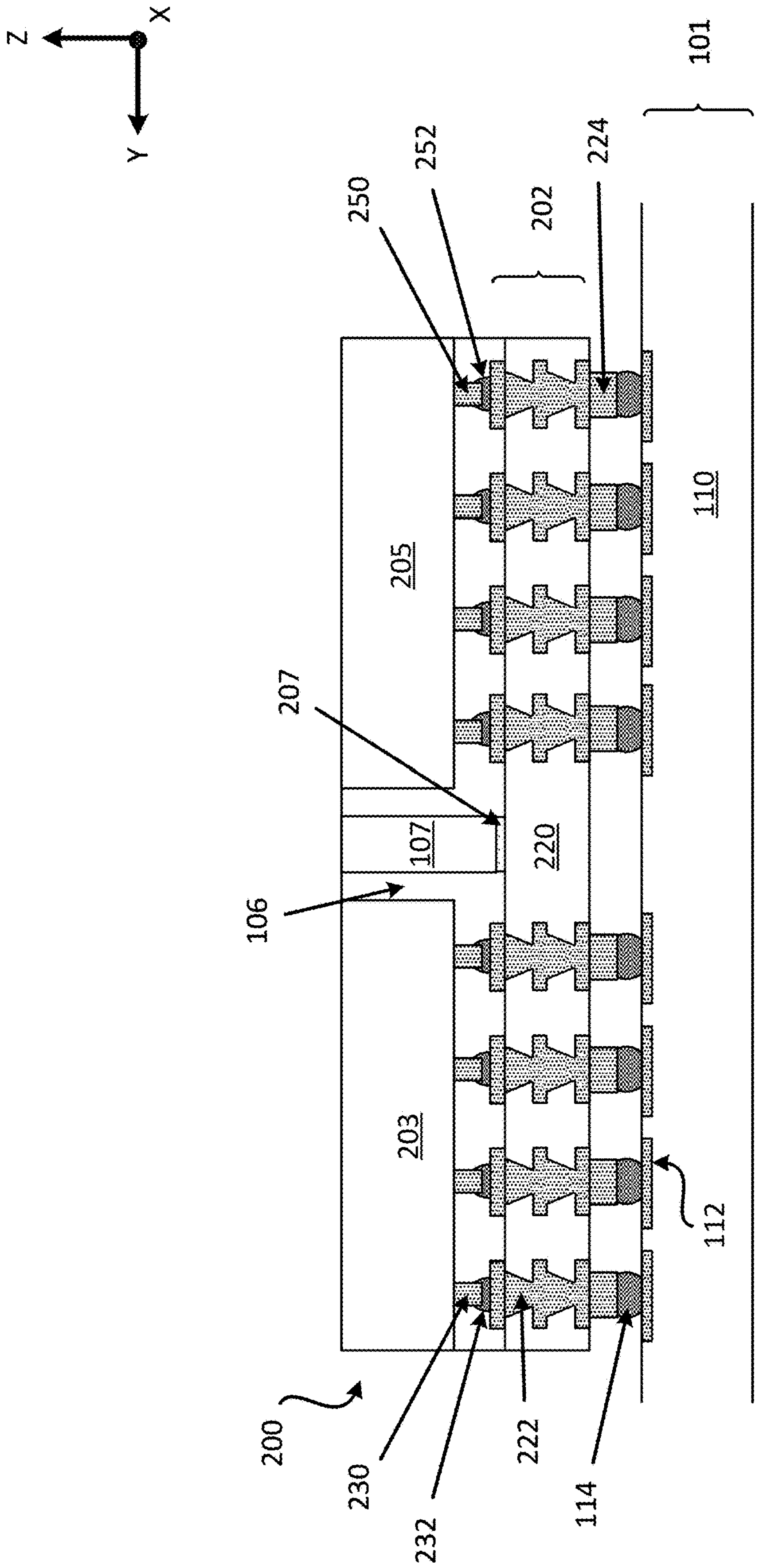
FIG. 2 illustrates an exemplary cross sectional profile view of a package comprising a dummy silicon structure.

FIG. 2 illustrates a cross sectional profile view of a package 200 that includes a dummy silicon structure. The package 200 is coupled to a board 101 through a plurality of solder interconnects 114. The board 101 includes at least one board dielectric layer 110 and a plurality of board interconnects 112. The board 101 may include a printed circuit board (PCB). In some implementations, the package 200 may be coupled to a substrate.

The package 200 includes a substrate 202, an integrated device 203, an integrated device 205, a dummy silicon structure 107 and an encapsulation layer 106. The substrate 202 includes at least one dielectric layer 220 and a plurality of metallization interconnects 222. A plurality of pillar interconnects 224 may be coupled to the plurality of metallization interconnects 222. The plurality of pillar interconnects 224 may be considered part of the substrate 202. The plurality of solder interconnects 114 may be coupled to the plurality of pillar interconnects 224 and the plurality of board interconnects 112.

The integrated device 203 may be a first integrated device. The integrated device 205 may be a second integrated device. The integrated device 203 is coupled to the substrate 202. For example, the integrated device 203 may be coupled to the substrate 202 through a plurality of pillar interconnects 230 and/or a plurality of solder interconnects 232. The integrated device 205 is coupled to the substrate 202. For example, the integrated device 205 may be coupled to the substrate 202 through a plurality of pillar interconnects 250 and/or a plurality of solder interconnects 252.

The encapsulation layer 106 is coupled to the substrate 202. The encapsulation layer 106 may at least partially encapsulate the integrated device 203, the integrated device 205 and the dummy silicon structure 107. Thus, the integrated device 203, the integrated device 205 and the dummy silicon structure 107 may be located at least partially in the encapsulation layer 106. The encapsulation layer 106 may include a mold, a resin, an epoxy and/or a filler.

The dummy silicon structure 107 may be located laterally between the integrated device 203 and the integrated device 205. The dummy silicon structure 107 may be free of transistors, passive devices and/or logic cells. The dummy silicon structure 107 may be free of any electrical connection with the integrated device 203 and/or the integrated device 205. For example, the dummy silicon structure 107 may be free of any electrical connection with transistors and/or logic cells of the integrated device 203 and/or transistors and/or logic cells of the integrated device 205. The dummy silicon structure 107 may be free of any electrical connection with circuits of the integrated device 203 and/or circuits of the integrated device 205. The thickness and/or the height of the dummy silicon structure 107 may vary with different implementations. In some implementations, the dummy silicon structure 107 may be coupled to the substrate 202 through an adhesive 207. In some implementations, the adhesive 207 may include a die attach film (DAF). In some implementations, the dummy silicon structure 107 may extend through part of the height and/or vertical thickness of the encapsulation layer 106. In some implementations, the dummy silicon structure 107 may be located laterally to (i) the die substrate of the integrated device 203 and/or (ii) the die substrate of the integrated device 205. The dummy silicon structure 107 may be located adjacent to (i) an edge of the integrated device 203 comprising a die to die portion, and (ii) an edge of the integrated device 205 comprising a die to die portion. The dummy silicon structure 107 may represent one or more dummy silicon structures that are located between the integrated device 203 and the integrated device 205. Thus, in some implementations, a plurality of dummy silicon structures may be located in the encapsulation layer 106, and located between the integrated device 203 and the integrated device 205. In some implementations, one or more dummy silicon structures may be located in other locations of the package 200.

The use of at least one dummy silicon structure helps provides a more reliable package that is subject to less warpage. The silicon material of the dummy silicon structure 107 may be identical or closely matches to the material of the die substrate of the integrated device 203 and/or the material of the die substrate of the integrated device 205, which helps improve and/or minimize warpage of the package. Less warpage of the package may mean the less likelihood of cracking of joints and/or may mean more reliable joints and/or connections between different components of the package 200.

Figure 3:
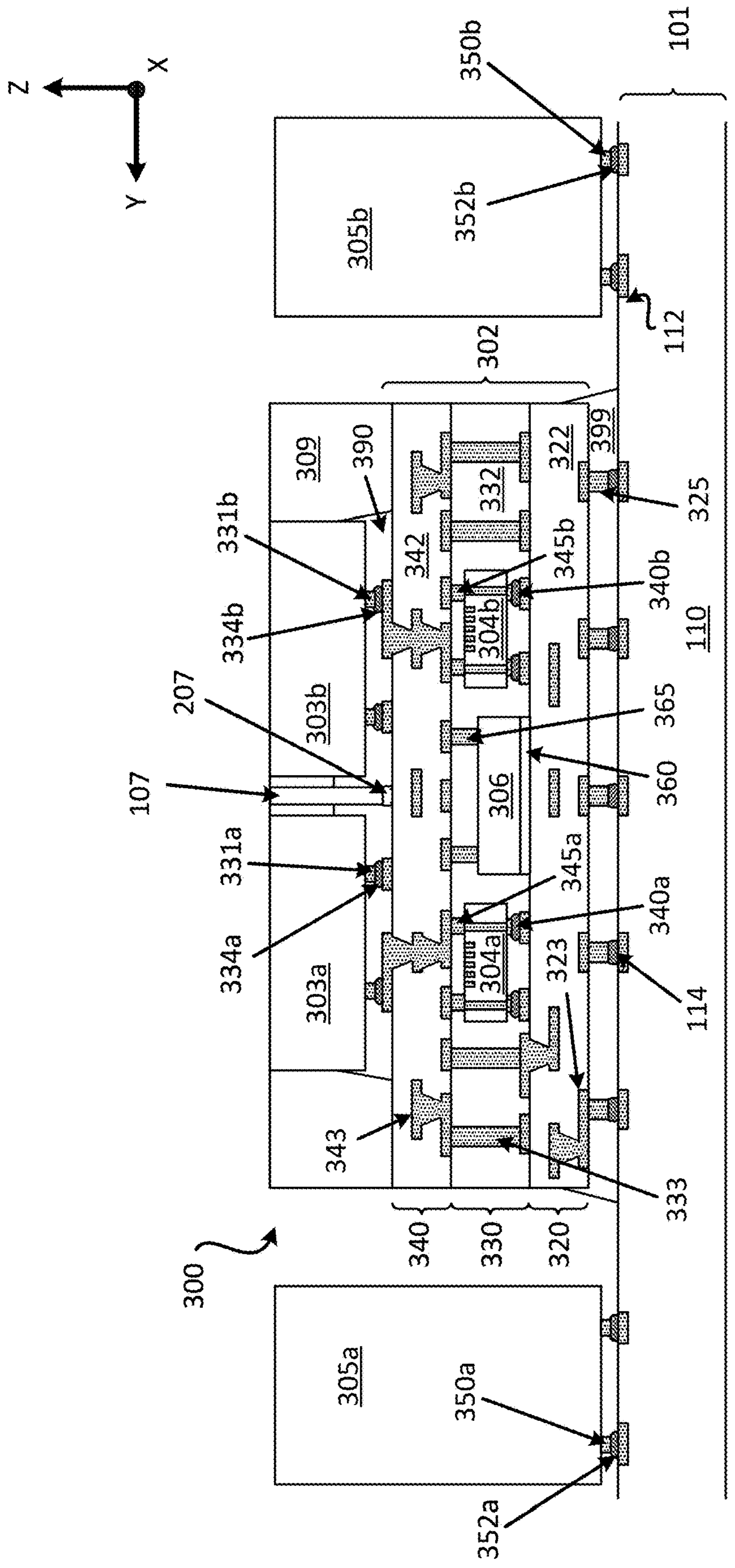
FIG. 3 illustrates an exemplary cross sectional profile view of a package comprising a dummy silicon structure.

FIG. 3 illustrates a cross sectional profile view of a package 300 that includes a package interposer and a dummy silicon structure. The package 300 is coupled to a board 101 through a plurality of solder interconnects 114. The board 101 includes at least one board dielectric layer 110 and a plurality of board interconnects 112. The board 101 may include a printed circuit board (PCB). In some implementations, instead of the board 101, the package 300 may be coupled to a substrate (e.g., laminated substrate) through the plurality of solder interconnects 114.

The package 300 includes a package interposer 302, an integrated device **303*a*, an integrated device 303*b*, a dummy silicon structure 107, an underfill 390 and an encapsulation layer 309. In some implementations, the integrated device 303*a* may include a first system on chip (SoC). In some implementations, the integrated device 303*b*** may include a second system on chip (SoC).

The package interposer 302 may be a package substrate. The package interposer 302 includes a metallization portion 320, an encapsulated portion 330, a metallization portion 340, and a plurality of pillar interconnects 325. In some implementations, the metallization portion 320 may be a first metallization portion and the metallization portion 340 may be a second metallization portion. The encapsulated portion 330 is coupled to the metallization portion 320 and the metallization portion 340. The encapsulated portion 330 is located between the metallization portion 320 and the metallization portion 340. The metallization portion 320 includes at least one dielectric layer 322 and a plurality of metallization interconnects 323. The at least one dielectric layer 322 may include prepreg and/or polyimide. The metallization portion 340 includes at least one dielectric layer 342 and a plurality of metallization interconnects 343. The at least one dielectric layer 342 may include prepreg and/or polyimide. The plurality of pillar interconnects 325 are coupled to the plurality of metallization interconnects 323 of the metallization portion 320. The plurality of pillar interconnects 325 may be considered part of the metallization portion 320. The plurality of pillar interconnects 325 are coupled to the plurality of solder interconnects 114.

The encapsulated portion 330 includes an encapsulation layer 332 and a plurality of post interconnects 333. The plurality of post interconnects 333 may include a plurality of through mold vias (TMVs). The encapsulated portion 330 also includes a passive device **304*a*, a passive device 304*b* and a bridge 306. The passive device 304*a*, the passive device 304*b* and/or the bridge 306 may be located at least partially in the encapsulation layer 332. Thus, the encapsulation layer 332 may at least partially encapsulate the passive device 304*a*, the passive device 304*b*, the bridge 306 and/or the plurality of post interconnects 333. The passive device 304*a* and/or the passive device 304*b*** may include a deep trench capacitor device.

The bridge 306 may include a silicon bridge. The bridge 306 may include a bridge substrate (e.g., silicon substrate, silicon bridge substrate) and a plurality of bridge interconnects. The bridge 306 may also include at least one bridge dielectric layer. The bridge 306 may include a plurality of post interconnects 365.

The encapsulation layer 332 may include a mold, a resin, an epoxy and/or a filler. The encapsulation layer 332 may be a means for encapsulation. The encapsulation layer 332 may be provided by using a compression and transfer molding process, a sheet molding process, or a liquid molding process. A back side of the passive device **304*a* is coupled to the metallization portion 320 through a plurality of solder interconnects 340*a* (e.g., coupled to the plurality of metallization interconnects 323 through the plurality of solder interconnects 340*a* plurality of solder interconnects 340*a*). A back side of the passive device 304*b* is coupled to the metallization portion 320 through a plurality of solder interconnects 340*b* (e.g., coupled to the plurality of metallization interconnects 323 through the plurality of solder interconnects 340*a* plurality of solder interconnects 340*b*). A back side of the bridge 306 is coupled to the metallization portion 320 through an adhesive 360** (e.g., die attach film (DAF)).

The plurality of post interconnects 333 extend through the encapsulation layer 332. The plurality of post interconnects 333 are coupled to the metallization portion 320 and the metallization portion 340. For example, the plurality of post interconnects 333 may be coupled to (i) the plurality of metallization interconnects 323 of the metallization portion 320 and (ii) the plurality of metallization interconnects 343 of the metallization portion 340. The passive device 304*a* includes a plurality of post interconnects 345*a*. The plurality of post interconnects 345*a* are coupled to and touch the passive device 304*a* and the plurality of metallization interconnects 343 of the metallization portion 340. The passive device 304*b* includes a plurality of post interconnects 345*b*. The plurality of post interconnects 345*b* are coupled to and touch the passive device 304*b* and the plurality of metallization interconnects 343 of the metallization portion 340. The plurality of post interconnects 365 are coupled to and touch the bridge 306 and the plurality of metallization interconnects 343 of the metallization portion 340.

The encapsulation layer 332, the passive device 304*a*, the passive device 304*b*, the bridge 306, the plurality of post interconnects 333, the plurality of post interconnects 345*a*, the plurality of post interconnects 345*b* and the plurality of post interconnects 365 are located between the metallization portion 320 and the metallization portion 340. The encapsulation layer 332 is coupled to the metallization portion 320 and the metallization portion 340. In some implementations, some of the metallization interconnects from the plurality of metallization interconnects 323 may be at least partially encapsulated by the encapsulation layer 332.

The integrated device 303*a* is coupled to a first surface of the metallization portion 340 through a plurality of pillar interconnects 331*a* and a plurality of solder interconnects 334*a*. The plurality of pillar interconnects 331*a* and/or the plurality of solder interconnects 334*a* may represent a plurality of bump interconnects. The integrated device 303*b* is coupled to a first surface of the metallization portion 340 through a plurality of pillar interconnects 331*b* and a plurality of solder interconnects 334*b*. The plurality of pillar interconnects 331*b* and/or the plurality of solder interconnects 334*b* may represent a plurality of bump interconnects.

The dummy silicon structure 107 may be located laterally between the integrated device 303*a* and the integrated device 303*b*. The dummy silicon structure 107 may be free of transistors, passive devices and/or logic cells. The dummy silicon structure 107 may be free of any electrical connection with the integrated device 303*a* and/or the integrated device 303*b*. For example, the dummy silicon structure 107 may be free of any electrical connection with transistors and/or logic cells of the integrated device 303*a* and/or transistors and/or logic cells of the integrated device 303*b*. The dummy silicon structure 107 may be free of any electrical connection with circuits of the integrated device 303*a* and/or circuits of the integrated device 303*b*. The thickness and/or the height of the dummy silicon structure 107 may vary with different implementations. In some implementations, the dummy silicon structure 107 may be coupled to the package interposer 302 through an adhesive 207. The adhesive 207 may include a die attach film (DAF). In some implementations, the dummy silicon structure 107 may extend through part of the height and/or vertical thickness of the encapsulation layer 309. In some implementations, the dummy silicon structure 107 may be located laterally to (i) the die substrate of the integrated device 303*a* and/or (ii) the die substrate of the integrated device 303*b*. The dummy silicon structure 107 may be located adjacent to (i) an edge of the integrated device 303*a* comprising a die to die portion, and (ii) an edge of the integrated device 303*b* comprising a die to die portion. The dummy silicon structure 107 may be one or more dummy silicon structures that are located between the integrated device 303*a* and the integrated device 303*b*. Thus, in some implementations, a plurality of dummy silicon structures may be located in the encapsulation layer 309, and located between the integrated device 303*a* and the integrated device 303*b*.

An underfill 390 is located between the integrated device 303*a* and the package interposer 302. The underfill 390 is located between the integrated device 303*b* and the package interposer 302. The underfill 390 may at least partially encapsulate and/or touch the dummy silicon structure 107. In some implementations, the underfill 390 may include a composite material comprising an epoxy polymer with filler. An encapsulation layer 309 may be located over the package interposer 302. The package interposer 302 may be coupled to the underfill 390, the integrated device 303*a*, the integrated device 303*b*, the integrated device 305*a*, and/or the integrated device 305*b*. The encapsulation layer 309 may include a mold, a resin, an epoxy and/or a filler. The encapsulation layer 309 may be a means for encapsulation. The encapsulation layer 309 may be provided by using a compression and transfer molding process, a sheet molding process, or a liquid molding process. The encapsulation layer 309 may be different from the underfill 390. For example, the encapsulation layer 309 may include a different material and/or a different composition of material from the underfill 390. An underfill 399 may be located between the metallization portion 320 of the package interposer 302 and the board 101. The underfill 399 may be similar to the underfill 390.

The passive device 304*a* is configured to be electrically coupled to the integrated device 303*a* through the metallization portion 340. An electrical path between the integrated device 303*a* and the passive device 304*a* may include (i) a pillar interconnect from the plurality of pillar interconnects 331*a*, (ii) a solder interconnect from the plurality of solder interconnects 334*a*, (iii) at least one metallization interconnect from the plurality of metallization interconnects 343, and/or (iv) a post interconnect from the plurality of post interconnects 345*a*.

The passive device 304*b* is configured to be electrically coupled to the integrated device 303*b* through the metallization portion 340. An electrical path between the integrated device 303*b* and the passive device 304*b* may include (i) a pillar interconnect from the plurality of pillar interconnects 331*b*, (ii) a solder interconnect from the plurality of solder interconnects 334*b*, (iii) at least one metallization interconnect from the plurality of metallization interconnects 343, and/or (iv) a post interconnect from the plurality of post interconnects 345*b*.

In some implementations, an electrical path between the integrated device 303*a* and the integrated device 303*b* may include the metallization portion 340. In some implementations, an electrical path between the integrated device 303*a* and the integrated device 303*b* may include the metallization portion 340 and the bridge 306. For example, an electrical path between the integrated device 303*a* and the integrated device 303*b* may include (i) a pillar interconnect from the plurality of pillar interconnects 331*a*, (ii) a solder interconnect from the plurality of solder interconnects 334*a*, (iii) at least one metallization interconnect from the plurality of metallization interconnects 343, (iv) a post interconnect from the plurality of post interconnects 365, (v) the bridge 306, (vi) another post interconnect from the plurality of post interconnects 365, (vii) at least one other metallization interconnect from the plurality of metallization interconnects 343, (viii) a solder interconnect from the plurality of solder interconnects 334*b* and/or (ix) a pillar interconnect from the plurality of pillar interconnects 331*b*.

In some implementations, an electrical path between the metallization portion 320 and the metallization portion 340, may include at least one post interconnect from the plurality of post interconnects 333. In some implementations, an electrical path between the metallization portion 320 and the metallization portion 340, may include the passive device 304*a*. Thus, an electrical path between the metallization portion 320 and the metallization portion 340 may extend through the plurality of solder interconnects 340*a*, the passive device 304*a* and the plurality of post interconnects 345*a*. The plurality of post interconnects 345*a* may be considered part of the passive device 304*a*. In some implementations, an electrical path between the metallization portion 320 and the metallization portion 340, may include the passive device 304*b*. Thus, an electrical path between the metallization portion 320 and the metallization portion 340 may extend through the plurality of solder interconnects 340*b*, the passive device 304*b* and the plurality of post interconnects 345*b*. The plurality of post interconnects 345*b* may be considered part of the passive device 304*b*.

The integrated device 305*a* is coupled to the board 101 through a plurality of pillar interconnects 350*a* and/or a plurality of solder interconnects 352*a*. The integrated device 305*a* is coupled to the board 101 through a plurality of pillar interconnects 350*b* and/or a plurality of solder interconnects 352*b*. The integrated device 305*a* and/or the integrated device 305*b* may include a memory (e.g., memory die, memory integrated device). In some implementations, the integrated device 305*a* may include a first memory integrated device (e.g., first high density memory die, first high bandwidth memory). In some implementations, the integrated device 305*b* may include a second memory integrated device (e.g., second high density memory die, second high bandwidth memory). The integrated device 305*a* is configured to be electrically coupled to the integrated device 303*a* and/or the integrated device 303*b*. The integrated device 305*b* is configured to be electrically coupled to the integrated device 303*a* and/or the integrated device 303*b*.

Figure 4:
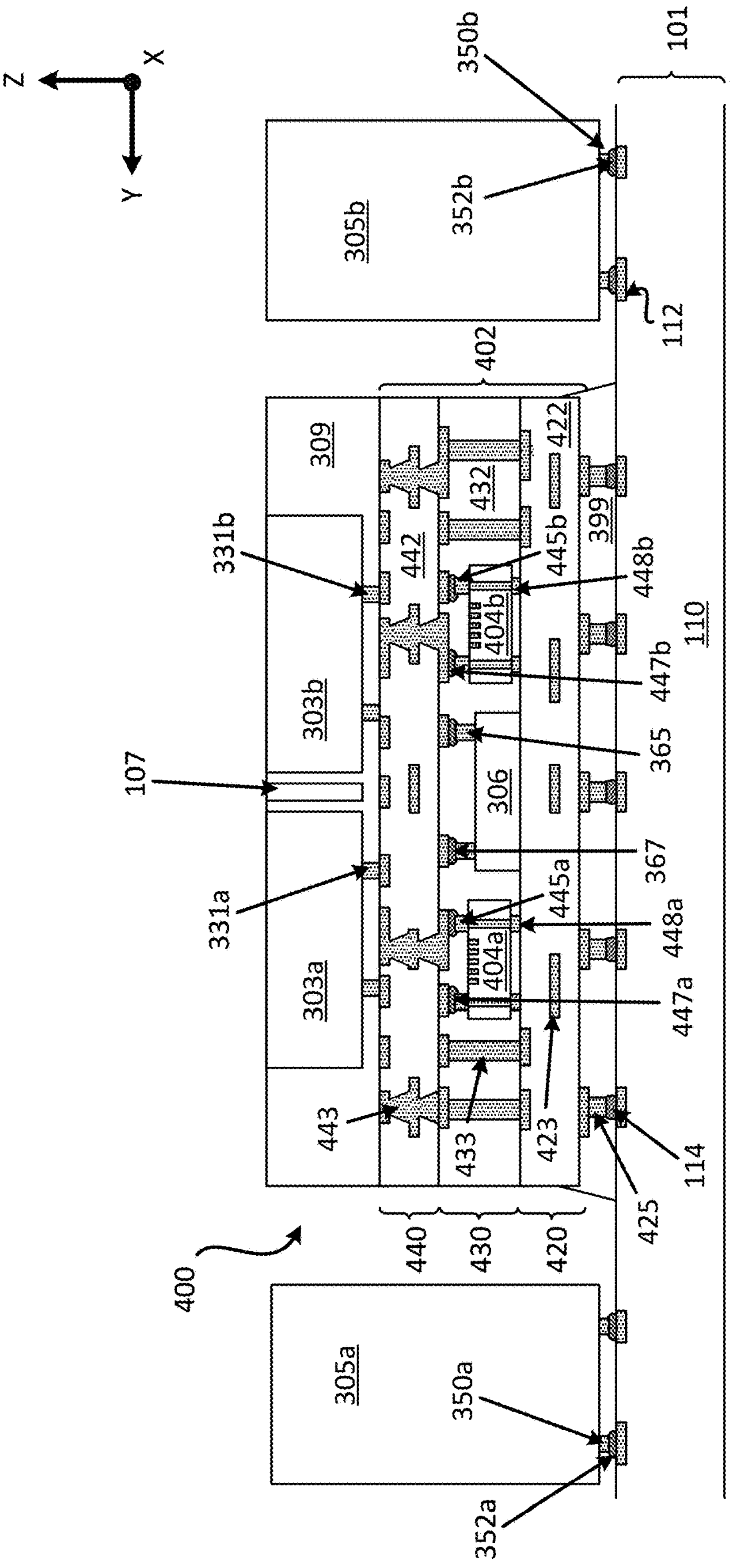
FIG. 4 illustrates an exemplary cross sectional profile view of a package comprising a dummy silicon structure.

FIG. 4 illustrates a cross sectional profile view of a package 400 that includes a package interposer and a dummy silicon structure. The package 400 is coupled to a board 101 through a plurality of solder interconnects 114. In some implementations, instead of the board 101, the package 400 may be coupled to a substrate (e.g., laminated substrate) through the plurality of solder interconnects 114.

The package 400 is similar to the package 300 of FIG. 3, and may include similar components that are arranged in a similar manner as described for the package 300. The package 400 includes a package interposer 402, an integrated device 303*a*, an integrated device 303*b*, a dummy silicon structure 107 and an encapsulation layer 309. In some implementations, the integrated device 303*a* may include a first system on chip (SoC). In some implementations, the integrated device 303*b* may include a second system on chip (SoC).

The package interposer 402 may be a package substrate. The package interposer 402 includes a metallization portion 420, an encapsulated portion 430, a metallization portion 440, and a plurality of pillar interconnects 425. In some implementations, the metallization portion 420 may be a first metallization portion and the metallization portion 440 may be a second metallization portion. The encapsulated portion 430 is coupled to the metallization portion 420 and the metallization portion 440. The encapsulated portion 430 is located between the metallization portion 420 and the metallization portion 440. The metallization portion 420 includes at least one dielectric layer 422 and a plurality of metallization interconnects 423. The at least one dielectric layer 422 may include prepreg and/or polyimide. The metallization portion 440 includes at least one dielectric layer 442 and a plurality of metallization interconnects 443. The at least one dielectric layer 442 may include prepreg and/or polyimide. The plurality of pillar interconnects 425 are coupled to the plurality of metallization interconnects 423 of the metallization portion 420. The plurality of pillar interconnects 425 may be considered part of the metallization portion 420. The plurality of pillar interconnects 425 are coupled to the plurality of solder interconnects 114.

The encapsulated portion 430 includes an encapsulation layer 432 and a plurality of post interconnects 433. The encapsulated portion 430 also includes a passive device 404*a*, a passive device 404*b*, and a bridge 306. The passive device 404*a*, the passive device 404*b*, and/or the bridge 306 may be located at least partially in the encapsulation layer 432. Thus, the encapsulation layer 432 may at least partially encapsulate the passive device 404*a*, the passive device 404*a*, the bridge 306 and/or the plurality of post interconnects 433. The passive device 404*a* and/or the passive device 404*b* may include a deep trench capacitor device.

The bridge 306 may include a silicon bridge. The bridge 306 may include a bridge substrate (e.g., silicon substrate, silicon bridge substrate) and a plurality of bridge interconnects. The bridge 306 may also include at least one bridge dielectric layer. The bridge 306 may include a plurality of post interconnects 365.

The encapsulation layer 432 may include a mold, a resin, an epoxy and/or a filler. The encapsulation layer 432 may be a means for encapsulation. The encapsulation layer 432 may be provided by using a compression and transfer molding process, a sheet molding process, or a liquid molding process. A back side of the passive device 404*a* is coupled to the metallization portion 420 through a plurality of interconnects 448*a*. A back side of the passive device 404*b* is coupled to the metallization portion 420 through a plurality of interconnects 448*b*. A back side of the bridge 306 is coupled to and touching the metallization portion 420.

The plurality of post interconnects 433 extend through the encapsulation layer 432. The plurality of post interconnects 433 may include a plurality of through mold vias (TMVs). The plurality of post interconnects 433 are coupled to the metallization portion 420 and the metallization portion 440. For example, the plurality of post interconnects 433 may be coupled to (i) the plurality of metallization interconnects 423 of the metallization portion 420 and (ii) the plurality of metallization interconnects 443 of the metallization portion 440.

The plurality of solder interconnects 447*a* may be coupled to the passive device 404*a* (e.g., coupled to the plurality of post interconnects 445*a* of the passive device 404*a*) and the plurality of metallization interconnects 443 of the metallization portion 440. The plurality of solder interconnects 447*b* may be coupled to the passive device 404*b* (e.g., coupled to the plurality of post interconnects 445*b* of the passive device 404*b*) and the plurality of metallization interconnects 443 of the metallization portion 440. The plurality of interconnects 448*a* are coupled to and touch the plurality of metallization interconnects 423. The plurality of interconnects 448*a* may be considered part of the passive device 404*a*. The plurality of interconnects 448*a* may be considered part of and/or coupled to a back side of the passive device 404*a*. The plurality of interconnects 448*b* are coupled to and touch the plurality of metallization interconnects 423. The plurality of interconnects 448*b* may be considered part of the passive device 404*b*. The plurality of interconnects 448*b* may be considered part of and/or coupled to a back side of the passive device 404*b*.

The front side of the passive device 404*a* faces in a direction of the metallization portion 440. The front side of the passive device 404*a* is coupled to metallization portion 440 through a plurality of solder interconnects 447*a*. The front side of the passive device 404*b* faces in a direction of the metallization portion 440. The front side of the passive device 404*b* is coupled to metallization portion 440 through a plurality of solder interconnects 447*b*. In some implementations, a front side of the passive device (e.g., 404*a*, 404*b*) may be a side of the passive device that includes a capacitor (e.g., trench capacitor).

The front side of the bridge 306 is coupled to the plurality of metallization interconnects 443 of the metallization portion 440 through the plurality of post interconnects 365 and the plurality of solder interconnects 367. The back side of the bridge 306 is coupled to and touch the metallization portion 420. In some implementations, a back side of the bridge 306 is the side that includes a bridge die substrate (e.g., silicon bridge die substrate).

The encapsulation layer 432, the passive device 404*a*, the passive device 404*b*, the bridge 306, the plurality of post interconnects 433, the plurality of post interconnects 445*a*, the plurality of post interconnects 445*b*, and the plurality of post interconnects 365 are located between the metallization portion 420 and the metallization portion 440. The encapsulation layer 432 is coupled to the metallization portion 420 and the metallization portion 440. In some implementations, some of the metallization interconnects from the plurality of metallization interconnects 423 may be at least partially encapsulated by the encapsulation layer 432.

The integrated device 303*a* may be coupled to a first surface of the metallization portion 440 through a plurality of pillar interconnects 331*a* and/or pad interconnects of the integrated device 303*a*. The integrated device 303*b* may be coupled to a first surface of the metallization portion 440 through a plurality of pillar interconnects 331*b* and/or pad interconnects of the integrated device 303*b*.

An encapsulation layer 309 may be located over the package interposer 402. The package interposer 402 may be coupled to the integrated device 303*a*, the integrated device 303*b* and the encapsulation layer 309. The encapsulation layer 309 may include a mold, a resin, an epoxy and/or a filler. The encapsulation layer 309 may be a means for encapsulation. The encapsulation layer 309 may be provided by using a compression and transfer molding process, a sheet molding process, or a liquid molding process.

The dummy silicon structure 107 may be located laterally between the integrated device 303*a* and the integrated device 303*b*. The dummy silicon structure 107 may be free of transistors, passive devices and/or logic cells. The dummy silicon structure 107 may be free of any electrical connection with the integrated device 303*a* and/or the integrated device 303*b*. The dummy silicon structure 107 may be free of any electrical connection with circuits of the integrated device 303*a* and/or circuits of the integrated device 303*b*. The thickness and/or the height of the dummy silicon structure 107 may vary with different implementations. In some implementations, the dummy silicon structure 107 may be coupled to the package interposer 302 through an adhesive 207. In some implementations, the dummy silicon structure 107 may extend through part of the height and/or vertical thickness of the encapsulation layer 309 or the entire height and/or vertical thickness of the encapsulation layer 309. In some implementations, the dummy silicon structure 107 may be located laterally to (i) the die substrate of the integrated device 303*a* and/or (ii) the die substrate of the integrated device 303*b*. The dummy silicon structure 107 may be located adjacent to (i) an edge of the integrated device 303*a* comprising a die to die portion, and (ii) an edge of the integrated device 303*b* comprising a die to die portion. The dummy silicon structure 107 may represent one or more dummy silicon structures that are located between the integrated device 303*a* and the integrated device 303*b*. Thus, in some implementations, a plurality of dummy silicon structures may be located in the encapsulation layer 309, and located between the integrated device 303*a* and the integrated device 303*b*.

The passive device 404*a* is configured to be electrically coupled to the integrated device 303*a* through the metallization portion 440. An electrical path between the integrated device 303*a* and the passive device 404*a* may include (i) a pillar interconnect from the plurality of pillar interconnects 331*a*, (ii) at least one metallization interconnect from the plurality of metallization interconnects 443, (iii) a solder interconnect from the plurality of solder interconnects 447*a* and/or (iv) a post interconnect from the plurality of post interconnects 445*a*.

The passive device 404*b* is configured to be electrically coupled to the integrated device 303*b* through the metallization portion 440. An electrical path between the integrated device 303*b* and the passive device 404*b* may include (i) a pillar interconnect from the plurality of pillar interconnects 331*b*, (ii) at least one metallization interconnect from the plurality of metallization interconnects 443, (iii) a solder interconnect from the plurality of solder interconnects 447*b* and/or (iv) a post interconnect from the plurality of post interconnects 445*b*.

In some implementations, an electrical path between the integrated device 303*a* and the integrated device 303*b* may include the metallization portion 440. In some implementations, an electrical path between the integrated device 303*a* and the integrated device 303*b* may include the metallization portion 440 and the bridge 306. For example, an electrical path between the integrated device 303*a* and the integrated device 303*b* may include (i) a pillar interconnect from the plurality of pillar interconnects 331*a*, (ii) at least one metallization interconnect from the plurality of metallization interconnects 443, (iii) a solder interconnect from the plurality of solder interconnects 367, (iv) a post interconnect from the plurality of post interconnects 365, (v) the bridge 306, (vi) another post interconnect from the plurality of post interconnects 365, (vii) another solder interconnect from the plurality of solder interconnects 367, (viii) at least one other metallization interconnect from the plurality of metallization interconnects 443, and/or (ix) a pillar interconnect from the plurality of pillar interconnects 331*b*.

In some implementations, an electrical path between the metallization portion 420 and the metallization portion 440, may include at least one post interconnect from the plurality of post interconnects 433. In some implementations, an electrical path between the metallization portion 420 and the metallization portion 440, may include the passive device 404*a*. Thus, an electrical path between the metallization portion 420 and the metallization portion 440 may extend through the plurality of interconnects 448*a*, the passive device 404*a*, the plurality of post interconnects 445*a* and the plurality of solder interconnects 447*a*. The plurality of post interconnects 445*a* and/or the plurality of interconnects

448*a* may be considered part of the passive device 404*a*. In some implementations, an electrical path between the metallization portion 420 and the metallization portion 440, may include the passive device 404*b*. Thus, an electrical path between the metallization portion 420 and the metallization portion 440 may extend through the plurality of interconnects 448*b*, the passive device 404*b*, the plurality of post interconnects 445*b* and the plurality of solder interconnects 447*b*. The plurality of post interconnects 445*b* and/or the plurality of interconnects 448*b* may be considered part of the passive device 404*b*.

The integrated device 305*a* is coupled to the board 101 through a plurality of pillar interconnects 350*a* and/or a plurality of solder interconnects 352*a*. The integrated device 305*a* is coupled to the board 101 through a plurality of pillar interconnects 350*b* and/or a plurality of solder interconnects 352*b*. The integrated device 305*a* and/or the integrated device 305*b* may include a memory (e.g., memory die, memory integrated device). In some implementations, the integrated device 305*a* may include a first memory integrated device (e.g., first high density memory die, fight high bandwidth memory). In some implementations, the integrated device 305*b* may include a second memory integrated device (e.g., second high density memory die, second high bandwidth memory). The integrated device 305*a* is configured to be electrically coupled to the integrated device 303*a* and/or the integrated device 303*b*. The integrated device 305*b* is configured to be electrically coupled to the integrated device 303*a* and/or the integrated device 303*b*.

Figure 5:
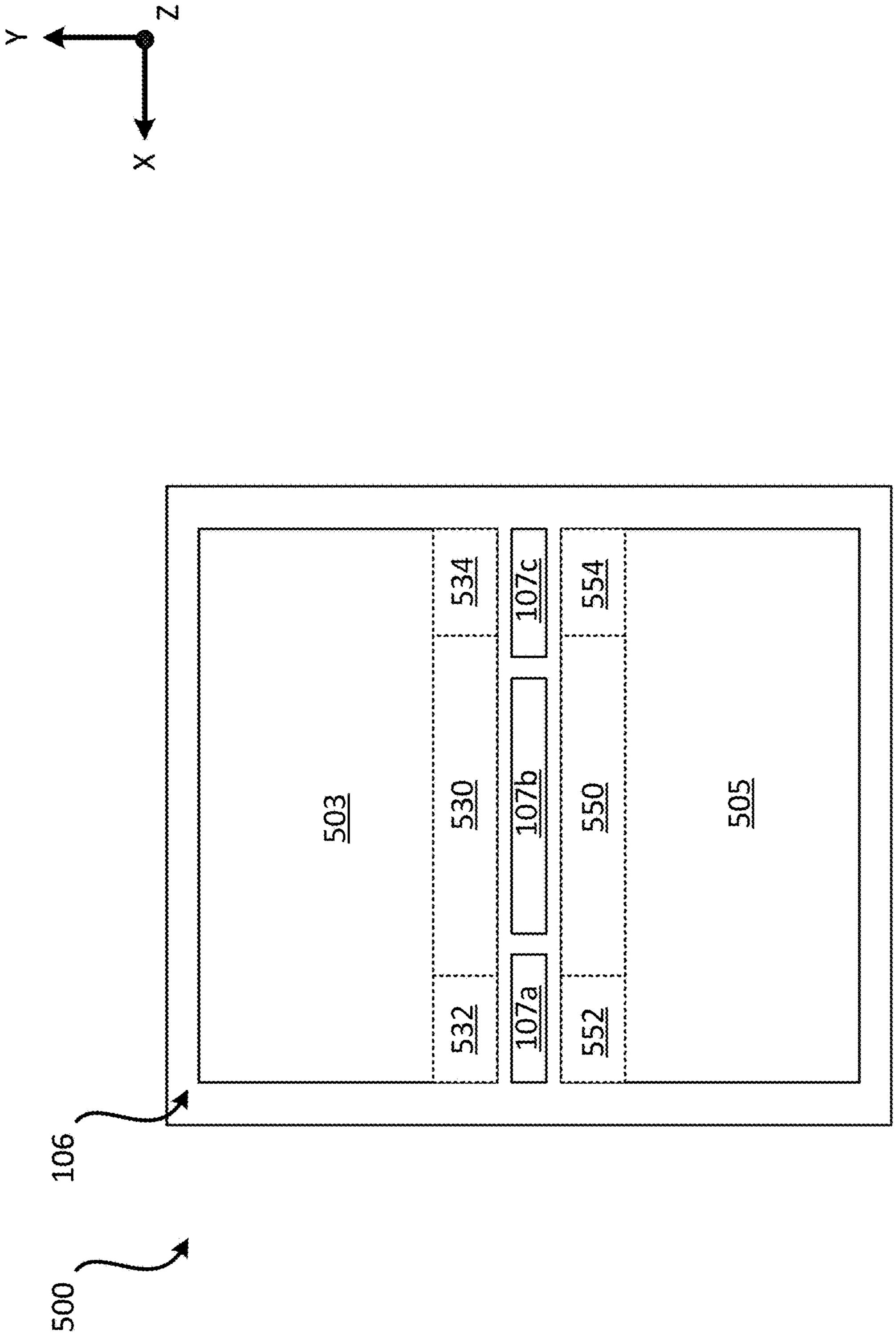
FIG. 5 illustrates an exemplary plan view of a package comprising a dummy silicon structure.

FIG. 5 illustrates a plan view of a package 500 that includes a dummy silicon structure. The package 500 may be a representation of the package 100, the package 200, the package 300 and/or the package 400 of the disclosure. The package 500 includes an integrated device 503, an integrated device 505, a first dummy silicon structure 107*a*, a second dummy silicon structure 107*b*, a third dummy silicon structure 107*c*, and an encapsulation layer 106. The encapsulation layer 106 may at least partially encapsulate the integrated device 503, the integrated device 505, the first dummy silicon structure 107*a*, the second dummy silicon structure 107*b*, and/or the third dummy silicon structure 107*c*. The encapsulation layer 106 may be coupled to a package interposer, a metallization portion and/or a substrate.

The integrated device 503 includes a die to die portion 530, a first block portion 532 and a second block portion 534. In some implementations, the first block portion 532 may be configured as an input/output block for the integrated device 503. In some implementations, the first block portion 532 may be configured as an IP block (e.g., first functional block) for the integrated device 503. In some implementations, the second block portion 534 may be configured as an input/output block for the integrated device 503. In some implementations, the second block portion 534 may be configured as an IP block (e.g., second functional block) for the integrated device 503.

The integrated device 505 includes a die to die portion 550, a first block portion 552 and a second block portion 554. In some implementations, the first block portion 552 may be configured as an input/output block for the integrated device 505. In some implementations, the first block portion 552 may be configured as an IP block (e.g., first functional block) for the integrated device 505. In some implementations, the second block portion 554 may be configured as an input/output block for the integrated device 505. In some implementations, the second block portion 554 may be configured as an IP block (e.g., second functional block) for the integrated device 505.

A die to die portion may be a portion of an integrated device that includes interconnects that are configured to provide an electrical path between two integrated devices. An input/output block may be a portion of an integrated device that includes interconnects that are configured to provide an electrical path for input/output signals. An IP block may be a portion of an integrated device that includes transistors and/or logic cells for performing one or more functions.

The first dummy silicon structure 107*a*, the second dummy silicon structure 107*b*, and the third dummy silicon structure 107*c* are located laterally between the integrated device 503 and the integrated device 505. The first dummy silicon structure 107*a*, the second dummy silicon structure 107*b*, and the third dummy silicon structure 107*c* may be located adjacent to an edge of the integrated device 503 that includes the die to die portion 530, the first block portion 532 and the second block portion 534. The first dummy silicon structure 107*a*, the second dummy silicon structure 107*b*, and the third dummy silicon structure 107*c* may be located adjacent to an edge of the integrated device 505 that includes the die to die portion 550, the first block portion 552 and the second block portion 554.

It is noted that different implementations may have a different number of dummy silicon structures with different shapes and/or sizes. In some implementations, a dummy silicon structure may be located at different locations within an encapsulation layer. For example, one or more dummy silicon structures may be located along a periphery of the package. In some implementations, a plurality of dummy silicon structures may laterally surround one or more integrated devices. In some implementations, a plurality of dummy silicon structures may be located along a periphery of the package. In some implementations, other components and/or other materials may be used instead of and/or in conjunction with the dummy silicon structure. Thus, for example another dummy structure comprising a different material and/or composition may be used and implemented in the packages of the disclosure.

An integrated device (e.g., 303, 305) may include a die (e.g., semiconductor bare die). The integrated device may include a power management integrated circuit (PMIC). The integrated device may include an application processor. The integrated device may include a modem. The integrated device may include a radio frequency (RF) device, a passive device, a filter, a capacitor, an inductor, an antenna, a transmitter, a receiver, a gallium arsenide (GaAs) based integrated device, a surface acoustic wave (SAW) filter, a bulk acoustic wave (BAW) filter, a light emitting diode (LED) integrated device, a silicon (Si) based integrated device, a silicon carbide (SiC) based integrated device, a memory, power management processor, and/or combinations thereof. An integrated device may include at least one electronic circuit (e.g., first electronic circuit, second electronic circuit, etc. . . . ). An integrated device may include an input/output (I/O) hub. An integrated device may include transistors. An integrated device may be an example of an electrical component and/or electrical device.

In some implementations, an integrated device may be a chiplet. A chiplet may be fabricated using a process that provides better yields compared to other processes used to fabricate other types of integrated devices, which can lower the overall cost of fabricating a chiplet. Different chiplets may have different sizes and/or shapes. Different chiplets may be configured to provide different functions. Different chiplets may have different interconnect densities (e.g., interconnects with different width and/or spacing). In some implementations, several chiplets may be used to perform the functionalities of one or more chips (e.g., one more integrated devices). As mentioned above, using several chiplets that perform several functions may reduce the overall cost of a package relative to using a single chip to perform all of the functions of a package. In some implementations, one or more of the chiplets and/or one of more of integrated devices (e.g., 103) described in the disclosure may be fabricated using the same technology node or two or more different technology nodes. For example, an integrated device may be fabricated using a first technology node, and a chiplet may be fabricated using a second technology node that is not as advanced as the first technology node. In such an example, the integrated device may include components (e.g., interconnects, transistors) that have a first minimum size, and the chiplet may include components (e.g., interconnects, transistors) that have a second minimum size, where the second minimum size is greater than the first minimum size. In some implementations, a first integrated device and a second integrated device of a package, may be fabricated using the same technology node or different technology nodes. In some implementations, a chiplet and another chiplet of a package, may be fabricated using the same technology node or different technology nodes.

A technology node may refer to a specific fabrication process and/or technology that is used to fabricate an integrated device and/or a chiplet. A technology node may specify the smallest possible size (e.g., minimum size) that can be fabricated (e.g., size of a transistor, width of trace, gap with between two transistors). Different technology nodes may have different yield loss. Different technology nodes may have different costs. Technology nodes that produce components (e.g., trace, transistors) with fine details are more expensive and may have higher yield loss, than a technology node that produces components (e.g., trace, transistors) with details that are less fine. Thus, more advanced technology nodes may be more expensive and may have higher yield loss, than less advanced technology nodes. When all of the functions of a package are implemented in single integrated devices, the same technology node is used to fabricate the entire integrated device, even if some of the functions of the integrated devices do not need to be fabricated using that particular technology node. Thus, the integrated device is locked into one technology node. To optimize the cost of a package, some of the functions can be implemented in different integrated devices and/or chiplets, where different integrated devices and/or chiplets may be fabricated using different technology nodes to reduce overall costs. For example, functions that require the use of the most advanced technology node may be implemented in an integrated device, and functions that can be implemented using a less advanced technology node can be implemented in another integrated device and/or one or more chiplets. One example, would be an integrated device, fabricated using a first technology node (e.g., most advanced technology node), that is configured to provide compute applications, and at least one chiplet, that is fabricated using a second technology node, that is configured to provide other functionalities, where the second technology node is not as costly as the first technology node, and where the second technology node fabricates components with minimum sizes that are greater than the minimum sizes of components fabricated using the first technology node. Examples of compute applications may include high performance computing and/or high performance processing, which may be achieved by fabricating and packing in as many transistors as possible in an integrated device, which is why an integrated device that is configured for compute applications may be fabricated using the most advanced technology node available, while other chiplets may be fabricated using less advanced technology nodes, since those chiplets may not require as many transistors to be fabricated in the chiplets. Thus, the combination of using different technology nodes (which may have different associated yield loss) for different integrated devices and/or chiplets, can reduce the overall cost of a package, compared to using a single integrated device to perform all the functions of the package.

Another advantage of splitting the functions into several integrated devices and/or chiplets, is that it allows improvements in the performance of the package without having to redesign every single integrated device and/or chiplet. For example, if a configuration of a package uses a first integrated device and a first chiplet, it may be possible to improve the performance of the package by changing the design of the first integrated device, while keeping the design of the first chiplet the same. Thus, the first chiplet could be reused with the improved and/or different configured first integrated device. This saves cost by not having to redesign the first chiplet, when packages with improved integrated devices are fabricated.

The package (e.g., 300) may be implemented in a radio frequency (RF) package. The RF package may be a radio frequency front end (RFFE) package. A package (e.g., 300) may be configured to provide Wireless Fidelity (WiFi) communication and/or cellular communication (e.g., 2G, 3G, 4G, 5G). The packages (e.g., 300) may be configured to support Global System for Mobile (GSM) Communications, Universal Mobile Telecommunications System (UMTS), and/or Long-Term Evolution (LTE). The packages (e.g., 100) may be configured to transmit and receive signals having different frequencies and/or communication protocols.

Exemplary Sequence for Fabricating a Package Comprising a Dummy Silicon Structure In some implementations, fabricating a package includes several processes. FIGS. 6A-6E illustrate an exemplary sequence for providing or fabricating a package. In some implementations, the sequence of FIGS. 6A-6E may be used to provide or fabricate the package 300. However, the process of FIGS. 6A-6E may be used to fabricate any of the packages (e.g., 200) described in the disclosure.

It should be noted that the sequence of FIGS. 6A-6E may combine one or more stages in order to simplify and/or clarify the sequence for providing or fabricating a package. In some implementations, the order of the processes may be changed or modified. In some implementations, one or more of processes may be replaced or substituted without departing from the scope of the disclosure.

Figure 6A:
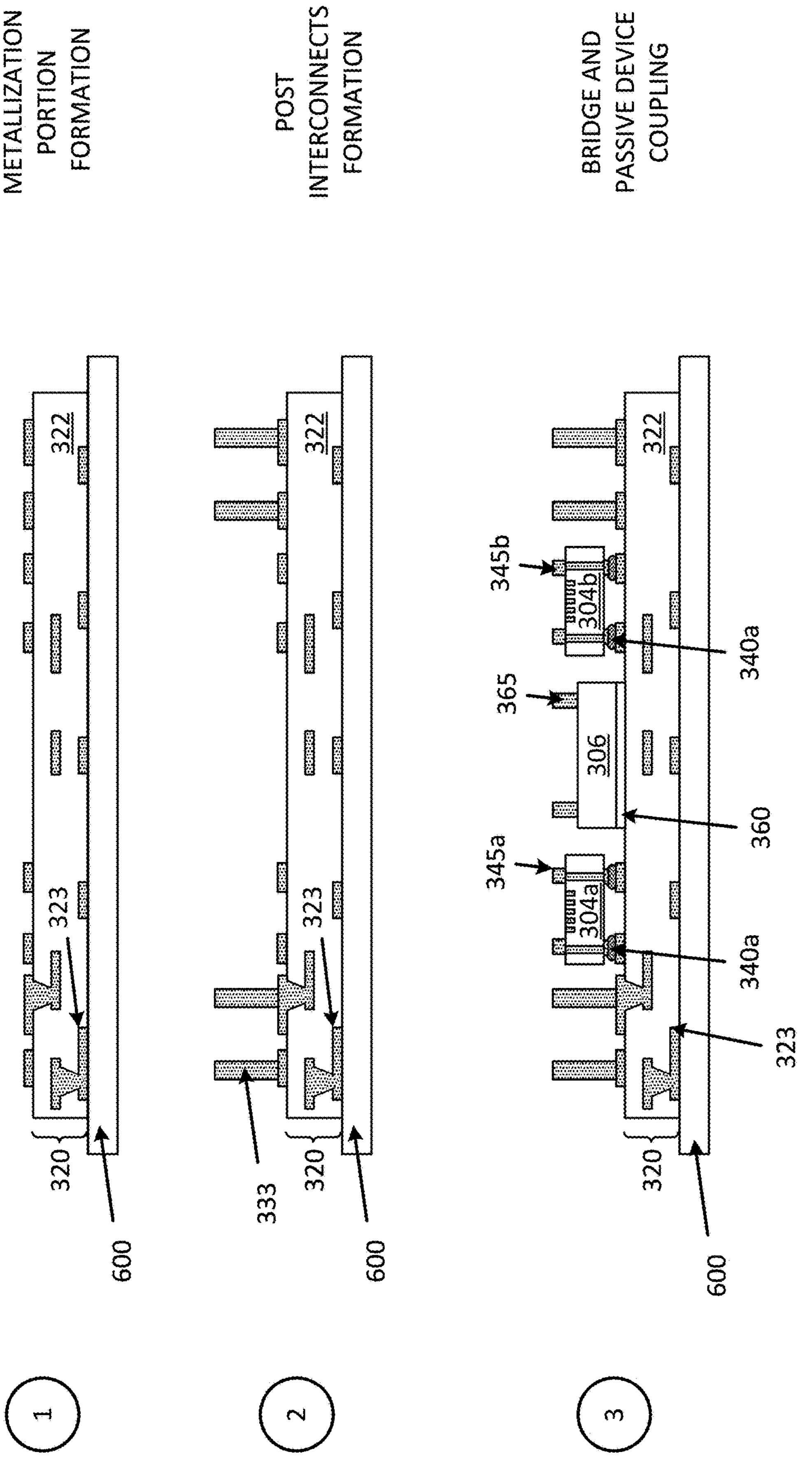
FIGS. 6A-6E illustrate an exemplary sequence for fabricating a package comprising a dummy silicon structure.

Stage 1 of FIG. 6A, illustrates a state after a carrier 600 and a metallization portion 320 is formed on the carrier 600. The carrier 600 may include a glass carrier. The metallization portion 320 includes at least one dielectric layer 322 and a plurality of metallization interconnects 323. In some implementations, the metallization portion 320 may be a first metallization portion. In some implementations, the at least one dielectric layer 322 may be an at least first dielectric layer. In some implementations, the plurality of metallization interconnects 323 may be a first plurality of metallization interconnects. In some implementations, a deposition process, a lamination process, an etching process (e.g., photo etching process), a laser process, an exposure process, a development process, a lithography process, a plating process, and/or a strip process may be used to form the metallization portion 320 comprising the at least one dielectric layer 322 and the plurality of metallization interconnects 323. An example of forming a metallization portion is illustrated and described below in at least FIGS. 10A-10B.

Stage 2 of FIG. 6A, illustrates a state after a plurality of post interconnects 333 are formed and coupled to the metallization portion 320. The plurality of post interconnects 333 may be coupled to the plurality of metallization interconnects 323. A lithography process, a plating process, a strip process and/or an etching process may be used to form the plurality of post interconnects 333. In some implementations, the metallization portion 320 may be optional. In such instances, the plurality of post interconnects 333 may be formed and coupled to the carrier 600.

Stage 3 of FIG. 6A, illustrates a state after a bridge 306 is coupled to the metallization portion 320. A back side of the bridge 306 is coupled to the metallization portion 320 through an adhesive 360. The bridge 306 may include the plurality of post interconnects 365. The back side of a bridge (e.g., silicon bridge) may be a side that includes a bridge substrate (e.g., silicon bridge substrate). The front side of a bridge may be a side that includes a bridge interconnect and/or a bridge dielectric layer.

Stage 3 of FIG. 6A, also illustrates a state after a passive device 304*a* and a passive device 304*b* are coupled to the metallization portion 320. A back side of the passive device 304*a* may be coupled to metallization portion 320 through a plurality of solder interconnects 340*a*. A back side of the passive device 304*b* may be coupled to metallization portion 320 through a plurality of solder interconnects 340*b*. The passive device 304*a* may include the plurality of post interconnects 345*a*. The passive device 304*b* may include the plurality of post interconnects 345*b*. A solder reflow process may be used to couple the passive device 304*a* and/or the passive device 304*b* to the metallization portion 320.

Figure 6B:
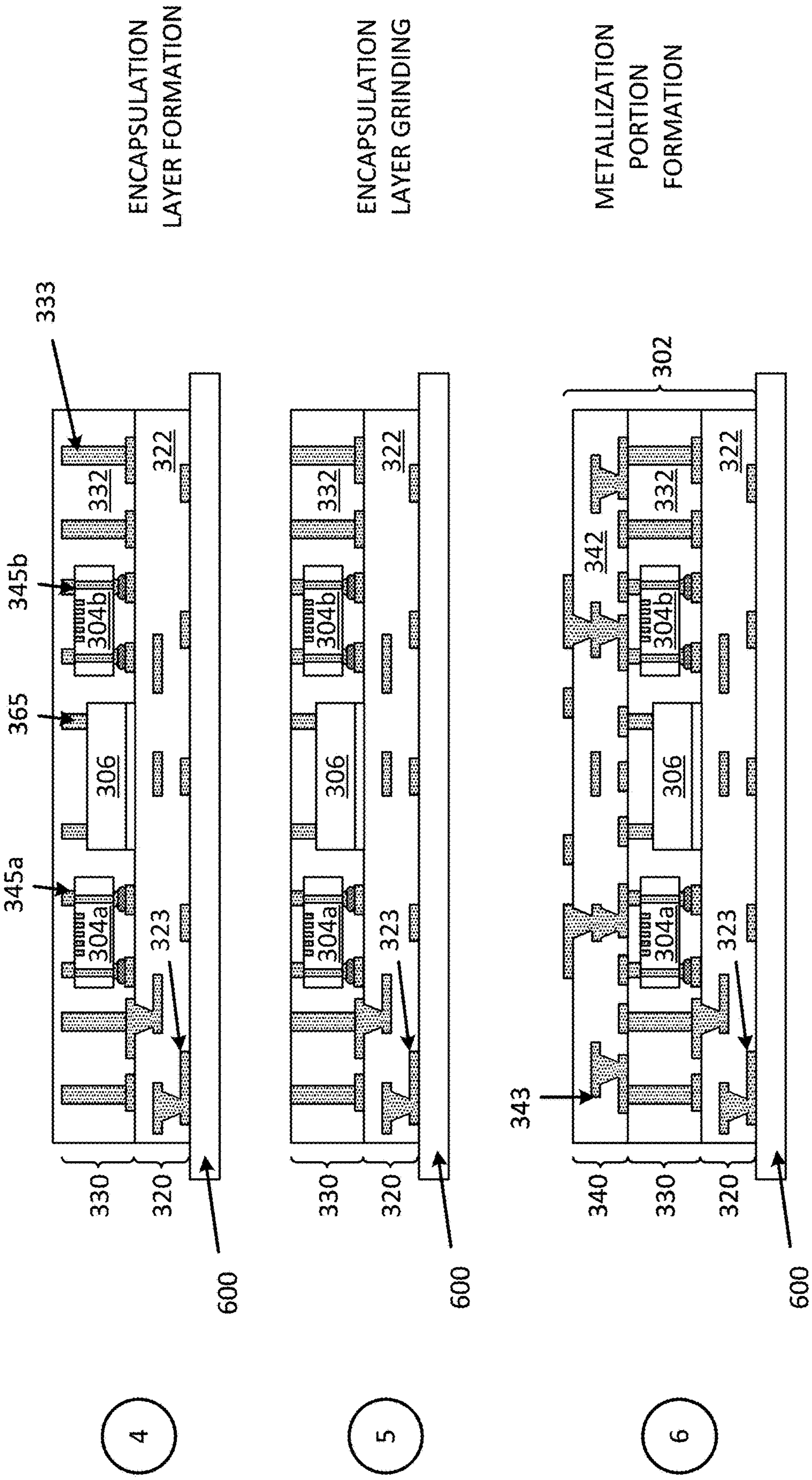

Stage 4 of FIG. 6B, illustrates a state after an encapsulation layer 332 is formed and coupled to the metallization portion 320. The encapsulation layer 332 may be a first encapsulation layer. The encapsulation layer 332 may include a mold, a resin, an epoxy and/or a filler. The encapsulation layer 332 may be a means for encapsulation. The encapsulation layer 332 may be provided by using a compression and transfer molding process, a sheet molding process, or a liquid molding process. The encapsulation layer 332 may at least partially encapsulate the plurality of post interconnects 333, the bridge 306, the passive device 304*a* and/or the passive device 304*b*, the plurality of post interconnects 365, the plurality of post interconnects 345*a* and/or the plurality of post interconnects 345*b*. The encapsulation layer 332 may be over molded.

Stage 5 of FIG. 6B, illustrates a state a portion of the encapsulation layer 332 is removed. The encapsulation layer 332 may be grinded to form an encapsulation layer 332 with a planar surface. Portions of the plurality of post interconnects 333 and/or other post interconnects (e.g., 345*a*, 345*b*, 365) may also be removed. Stage 5 of FIG. 6B, may illustrate the encapsulated portion 330 that is coupled to the metallization portion 320.

Stage 6 of FIG. 6B, illustrates a state after a metallization portion 340 is formed over and coupled to the encapsulated portion 330. The metallization portion 340 may be formed over the encapsulation layer 332. The metallization portion 340 includes at least one dielectric layer 342 and a plurality of metallization interconnects 343. In some implementations, the metallization portion 340 may be a second metallization portion. In some implementations, the at least one dielectric layer 342 may be an at least second dielectric layer. In some implementations, the plurality of metallization interconnects 343 may be a second plurality of metallization interconnects. The plurality of metallization interconnects 343 may be coupled to the plurality of post interconnects 333 and/or other post interconnects (e.g., 345*a*, 345*b*, 365) in the encapsulation layer 332. In some implementations, a deposition process, a lamination process, an etching process (e.g., photo etching process), a laser process, an exposure process, a development process, a lithography process, a plating process, and/or a strip process may be used to form the metallization portion 340 comprising the at least one dielectric layer 342 and the plurality of metallization interconnects 343. An example of forming a metallization portion is illustrated and described below in at least FIGS. 10A-10B. Stage 6 may illustrate a package interposer 302 that includes the metallization portion 320, the encapsulated portion 330 and the metallization portion 340. The encapsulated portion 330 may be located between the metallization portion 320 and the metallization portion 340.

Figure 6C:
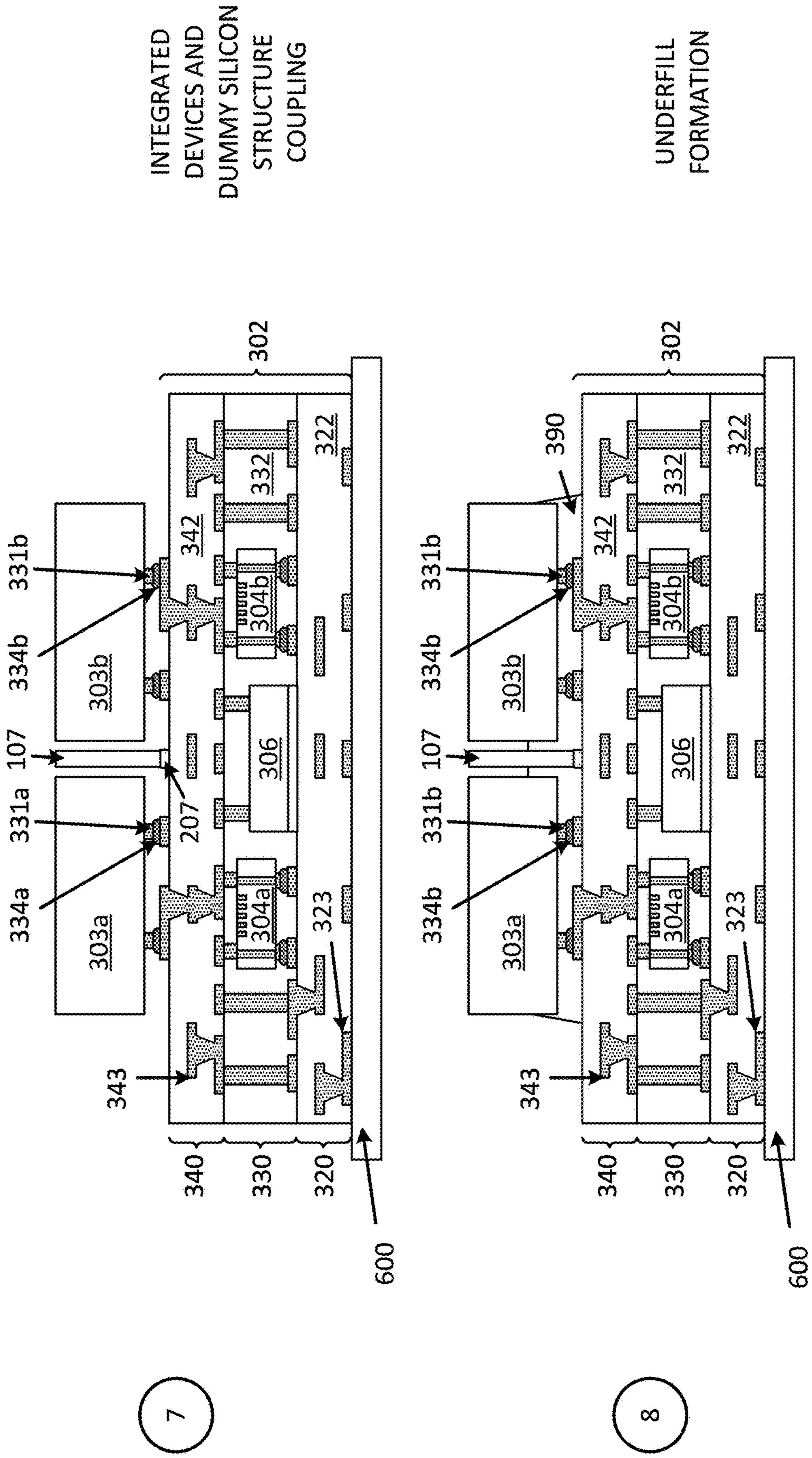

Stage 7 of FIG. 6C, illustrates a state after integrated devices are coupled to the package interposer 302. The integrated device 303*a* is coupled to the metallization portion 340 through a plurality of pillar interconnects 331*a* and a plurality of solder interconnects 334*a*. A solder reflow process may be used to couple the integrated device 303*a* to the metallization portion 340. The integrated device 303*b* is coupled to the metallization portion 340 through a plurality of pillar interconnects 331*b* and a plurality of solder interconnects 334*b*. A solder reflow process may be used to couple the integrated device 303*b* to the metallization portion 340. The dummy silicon structure 107 may be coupled to the metallization portion 340 through an adhesive 207. In some implementations, more than one dummy silicon structure 107 may be provided. The dummy silicon structure 107 may be located laterally between the integrated device 303*a* and the integrated device 303*b*.

Stage 8 of FIG. 6C, illustrates a state after an underfill 390 is provided. The underfill 390 may be disposed on the package interposer 302. The underfill 390 may be located between (i) the metallization portion 340 and (ii) the integrated device 303*a* and/or the integrated device 303*b*. In some implementations, the underfill 390 may include a composite material comprising an epoxy polymer with filler. The underfill 390 may at least partially encapsulate the dummy silicon structure 107.

Figure 6D:
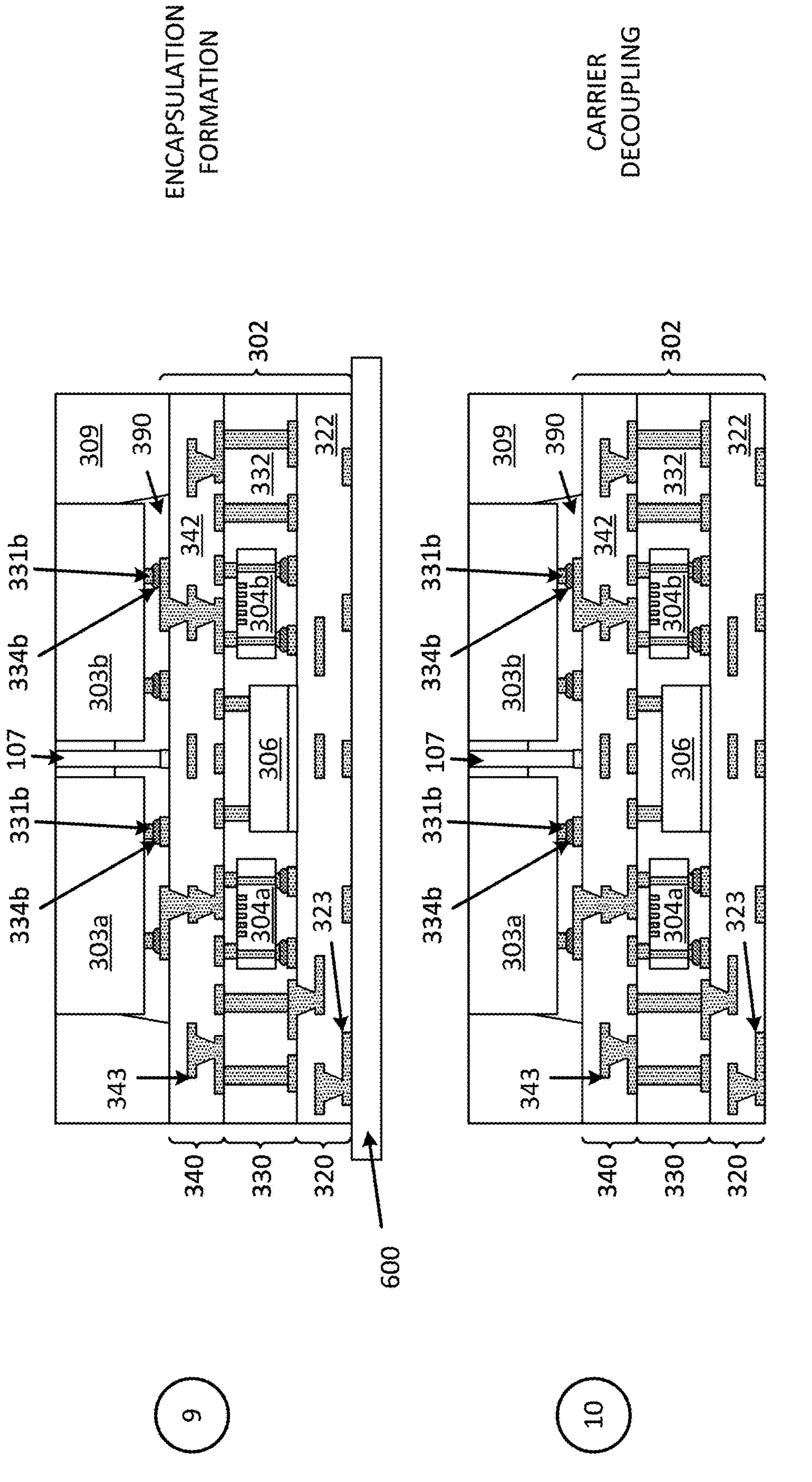

Stage 9 of FIG. 6D, illustrates a state after an encapsulation layer 309 is formed and coupled to the package interposer 302. The encapsulation layer 309 is coupled to the metallization portion 340. The encapsulation layer 309 may include a mold, a resin, an epoxy and/or a filler. The encapsulation layer 309 may be a means for encapsulation. The encapsulation layer 309 may be provided by using a compression and transfer molding process, a sheet molding process, or a liquid molding process. The encapsulation layer 309 may include a different material and/or a different composition from the underfill 390. The encapsulation layer 309 may be over molded and a grinding process may be used to remove a portion of the encapsulation layer 309. The encapsulation layer 309 may at least partially encapsulate the integrated device 303*a*, the integrated device 303*b* and/or the dummy silicon structure 107.

Stage 10 of FIG. 6D, illustrates a state after the package interposer 302 is decoupled from the carrier 600. The package interposer 302 may be detached from the carrier 600.

Figure 6E:
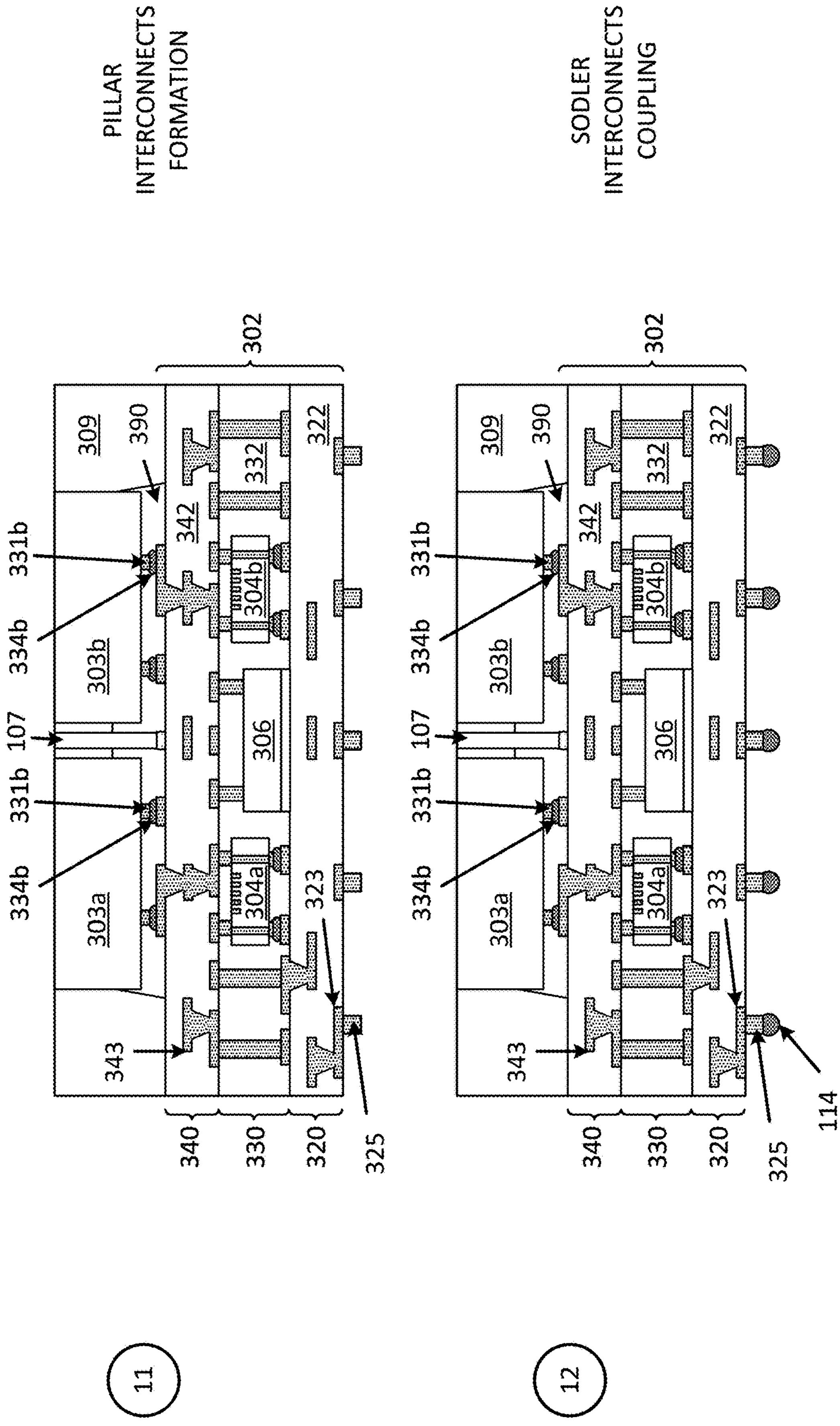

Stage 11 of FIG. 6E, illustrates a state after a plurality of pillar interconnects 325 are formed and coupled to the metallization portion 320. The plurality of pillar interconnects 325 may be coupled to the plurality of metallization interconnects 323. A lithography process, a plating process, a strip process and/or an etching process may be used to form the plurality of pillar interconnects 325. The plurality of pillar interconnects 325 may be optional.

Stage 12 of FIG. 6E, illustrates a state after a plurality of solder interconnects 114 are coupled to the plurality of pillar interconnects 325. A solder reflow process may be used to couple the plurality of pillar interconnects 325. In some implementations, the plurality of solder interconnects 114 may be coupled to the plurality of metallization interconnects 323. Stage 12 of FIG. 6E may illustrate a package 300.

Different implementations may use different processes for forming the metal layer(s) and/or interconnects. In some implementations, a chemical vapor deposition (CVD) process, a physical vapor deposition (PVD) process, a sputtering process, a spray coating process, and/or a plating process may be used to form the metal layer(s).

Figure 7:
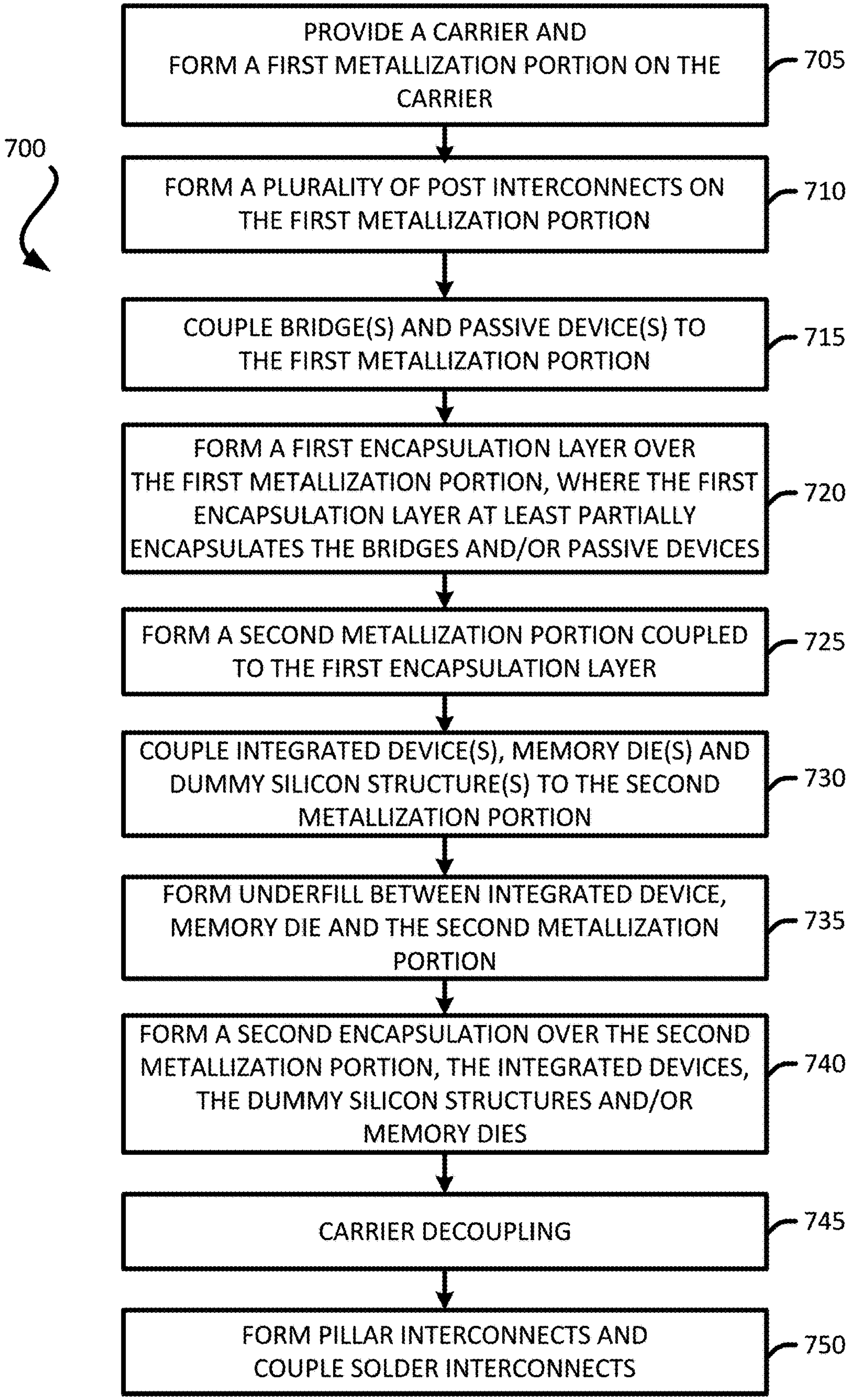
FIG. 7 illustrates an exemplary flow chart of a method for fabricating a package comprising a dummy silicon structure.

Exemplary Flow Diagram of a Method for Fabricating a Package Comprising a Dummy Silicon Structure In some implementations, fabricating a package includes several processes. FIG. 7 illustrates an exemplary flow diagram of a method 700 for providing or fabricating a package. In some implementations, the method 700 of FIG. 7 may be used to provide or fabricate the package 300 described in the disclosure. However, the method 700 may be used to provide or fabricate any of the packages (e.g., 200) described in the disclosure.

It should be noted that the method 700 of FIG. 7 may combine one or more processes in order to simplify and/or clarify the method for providing or fabricating a package. In some implementations, the order of the processes may be changed or modified.

The method provides (at 705) a carrier and forms a first metallization portion on the carrier. Stage 1 of FIG. 6A, illustrates and describes an example of a state after a carrier 600 and a metallization portion 320 is formed on the carrier 600. The carrier 600 may include a glass carrier. The metallization portion 320 includes at least one dielectric layer 322 and a plurality of metallization interconnects 323. In some implementations, the metallization portion 320 may be a first metallization portion. In some implementations, the at least one dielectric layer 322 may be an at least first dielectric layer. In some implementations, the plurality of metallization interconnects 323 may be a first plurality of metallization interconnects. In some implementations, a deposition process, a lamination process, an etching process (e.g., photo etching process), a laser process, an exposure process, a development process, a lithography process, a plating process, and/or a strip process may be used to form the metallization portion 320 comprising the at least one dielectric layer 322 and the plurality of metallization interconnects 323. An example of forming a metallization portion is illustrated and described below in at least FIGS. 10A-10B.

The method forms (at 710) a plurality of post interconnects on the first metallization portion. Stage 2 of FIG. 6A, illustrates and describes an example of a state after a plurality of post interconnects 333 are formed and coupled to the metallization portion 320. The plurality of post interconnects 333 may be coupled to the plurality of metallization interconnects 323. A lithography process, a plating process, a strip process and/or an etching process may be used to form the plurality of post interconnects 333. In some implementations, the metallization portion 320 may be optional. In such instances, the plurality of post interconnects 333 may be formed and coupled to the carrier 600.

The method couples (at 715) at least one bridge and/or at least passive device to the first metallization portion. Stage 3 of FIG. 6A, illustrates and describes an example of a state after a bridge 306 is coupled to the metallization portion 320. A back side of the bridge 306 is coupled to the metallization portion 320 through an adhesive 360. The bridge 306 may include the plurality of post interconnects 365. The back side of a bridge (e.g., silicon bridge) may be a side that includes a bridge substrate (e.g., silicon bridge substrate). The front side of a bridge may be a side that includes a bridge interconnect and/or a bridge dielectric layer. Stage 3 of FIG. 6A, also illustrates and describes an example of a state after a passive device 304*a* and a passive device 304*b* are coupled to the metallization portion 320. A back side of the passive device 304*a* may be coupled to metallization portion 320 through a plurality of solder interconnects 340*a*. A back side of the passive device 304*b* may be coupled to metallization portion 320 through a plurality of solder interconnects 340*b*. The passive device 304*a* may include the plurality of post interconnects 345*a*. The passive device 304*b* may include the plurality of post interconnects 345*b*. A solder reflow process may be used to couple the passive device 304*a* and/or the passive device 304*b* to the metallization portion 320.

The method forms (at 720) a first encapsulation layer over the first metallization portion. Stage 4 of FIG. 6B, illustrates and describes an example of a state after an encapsulation layer 332 is formed and coupled to the metallization portion 320. The encapsulation layer 332 may be a first encapsulation layer. The encapsulation layer 332 may include a mold, a resin, an epoxy and/or a filler. The encapsulation layer 332 may be a means for encapsulation. The encapsulation layer 332 may be provided by using a compression and transfer molding process, a sheet molding process, or a liquid molding process. The encapsulation layer 332 may at least partially encapsulate the plurality of post interconnects 333, the bridge 306 the passive device 304*a* and/or the passive device 304*b*, the plurality of post interconnects 365, the plurality of post interconnects 345*a* and/or the plurality of post interconnects 345*b*. The encapsulation layer 332 may be over molded. Forming the first encapsulation layer may include removing portions of the first encapsulation layer. Stage 5 of FIG. 6B, illustrates and describes an example of a state a portion of the encapsulation layer 332 is removed. The encapsulation layer 332 may be grinded to form an encapsulation layer 332 with a planar surface. Portions of the plurality of post interconnects 333 and/or other post interconnects may also be removed. Stage 5 of FIG. 6B, may illustrate the encapsulated portion 330 that is coupled to the metallization portion 320.

The method forms (at 725) a second metallization over the encapsulated portion. Stage 6 of FIG. 6B, illustrates and describes an example of a state after a metallization portion 340 is formed over and coupled to the encapsulated portion 330. The metallization portion 340 may be formed over the encapsulation layer 332. The metallization portion 340 includes at least one dielectric layer 342 and a plurality of metallization interconnects 343. In some implementations, the metallization portion 340 may be a second metallization portion. In some implementations, the at least one dielectric layer 342 may be an at least second dielectric layer. In some implementations, the plurality of metallization interconnects 343 may be a second plurality of metallization interconnects. The plurality of metallization interconnects 343 may be coupled to the plurality of post interconnects 333 and/or other post interconnects in the encapsulation layer 332. In some implementations, a deposition process, a lamination process, an etching process (e.g., photo etching process), a laser process, an exposure process, a development process, a lithography process, a plating process, and/or a strip process may be used to form the metallization portion 340 comprising the at least one dielectric layer 342 and the plurality of metallization interconnects 343. An example of forming a metallization portion is illustrated and described below in at least FIGS. 10A-10B. Stage 6 may illustrate a package interposer 302 that includes the metallization portion 320, the encapsulated portion 330 and the metallization portion 340. The encapsulated portion 330 may be located between the metallization portion 320 and the metallization portion 340.

The method places and couples (at 730) integrated devices, memory dies and/or dummy silicon structures to the second metallization portion. Stage 7 of FIG. 6C, illustrates and describes an example of a state after integrated devices are coupled to the package interposer 302. The integrated device 303*a* is coupled to the metallization portion 340 through a plurality of pillar interconnects 331*a* and a plurality of solder interconnects 334*a*. A solder reflow process may be used to couple the integrated device 303*a* to the metallization portion 340. The integrated device 303*b* is coupled to the metallization portion 340 through a plurality of pillar interconnects 331*b* and a plurality of solder interconnects 334*b*. A solder reflow process may be used to couple the integrated device 303*b* to the metallization portion 340. The dummy silicon structure 107 may be coupled to the metallization portion 340 through an adhesive 207. In some implementations, more than one dummy silicon structure 107 may be provided. The dummy silicon structure 107 may be located laterally between the integrated device 303*a* and the integrated device 303*b*.

The method provides and forms (at 735) an underfill. Stage 8 of FIG. 6C, illustrates and describes an example of a state after an underfill 390 is provided. The underfill 390 may be disposed on the package interposer 302. The underfill 390 may be located between (i) the metallization portion 340 and (ii) the integrated device 303*a* and/or the integrated device 303*b*. In some implementations, the underfill 390 may include a composite material comprising an epoxy polymer with filler. The underfill 390 may at least partially encapsulate the dummy silicon structure 107.

The method forms (at 740) a second encapsulation layer. Stage 9 of FIG. 6D, illustrates and describes an example of a state after an encapsulation layer 309 is formed and coupled to the package interposer 302. The encapsulation layer 309 is coupled to the metallization portion 340. The encapsulation layer 309 may include a mold, a resin, an epoxy and/or a filler. The encapsulation layer 309 may be a means for encapsulation. The encapsulation layer 309 may be provided by using a compression and transfer molding process, a sheet molding process, or a liquid molding process. The encapsulation layer 309 may include a different material and/or a different composition from the underfill 390. The encapsulation layer 309 may be over molded and a grinding process may be used to remove a portion of the encapsulation layer 309. The encapsulation layer 309 may at least partially encapsulate the integrated device 303*a*, the integrated device 303*b* and/or the dummy silicon structure 107.

The method decouples (at 745) the carrier. Stage 10 of FIG. 6D, illustrates and describes an example of a state after the package interposer 302 is decoupled from the carrier 600. The package interposer 302 may be detached from the carrier 600.

The method forms (at 750) a plurality of pillar interconnects and solder interconnects. Stage 11 of FIG. 6E, illustrates and describes an example of a state after a plurality of pillar interconnects 325 are formed and coupled to the metallization portion 320. The plurality of pillar interconnects 325 may be coupled to the plurality of metallization interconnects 323. A lithography process, a plating process, a strip process and/or an etching process may be used to form the plurality of pillar interconnects 325. The plurality of pillar interconnects 325 may be optional.

Stage 12 of FIG. 6E, illustrates and describes an example of a state after a plurality of solder interconnects 114 are coupled to the plurality of pillar interconnects 325. A solder reflow process may be used to couple the plurality of pillar interconnects 325. In some implementations, the plurality of solder interconnects 114 may be coupled to the plurality of metallization interconnects 323. Stage 12 of FIG. 6E may illustrate a package 300.

Different implementations may use different processes for forming the metal layer(s) and/or interconnects. In some implementations, a chemical vapor deposition (CVD) process, a physical vapor deposition (PVD) process, a sputtering process, a spray coating process, and/or a plating process may be used to form the metal layer(s).

Exemplary Sequence for Fabricating a Package Comprising a Dummy Silicon Structure In some implementations, fabricating a package includes several processes. FIGS. 8A-8E illustrate an exemplary sequence for providing or fabricating a package. In some implementations, the sequence of FIGS. 8A-8E may be used to provide or fabricate the package 400. However, the process of FIGS. 8A-8E may be used to fabricate any of the packages (e.g., 100) described in the disclosure.

It should be noted that the sequence of FIGS. 8A-8E may combine one or more stages in order to simplify and/or clarify the sequence for providing or fabricating a package. In some implementations, the order of the processes may be changed or modified. In some implementations, one or more of processes may be replaced or substituted without departing from the scope of the disclosure.

Figure 8A:
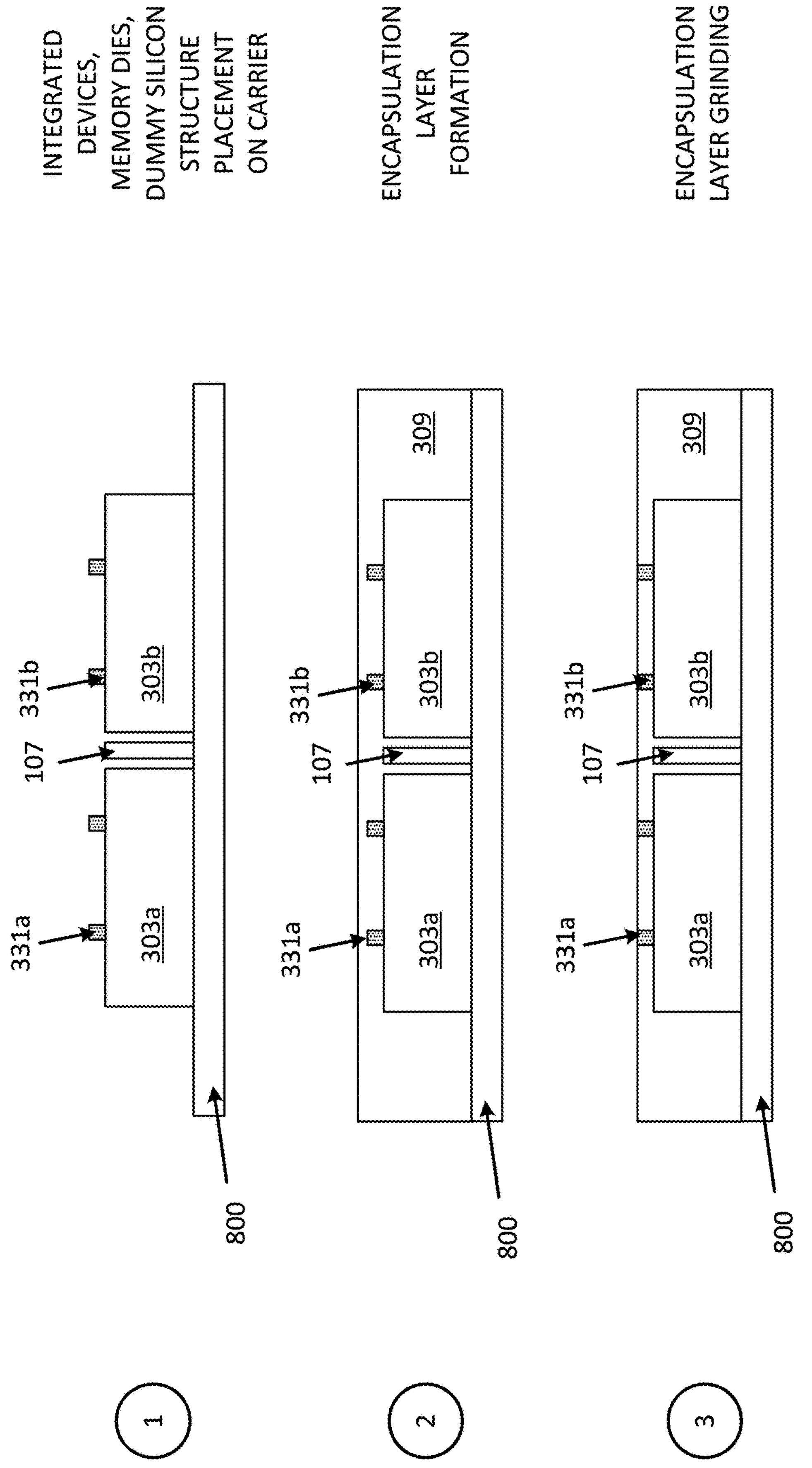
FIGS. 8A-8E illustrate an exemplary sequence for fabricating a package comprising a dummy silicon structure.

Stage 1 of FIG. 8A, illustrates a state after a carrier 800 and a plurality of integrated devices is placed on the carrier 800. The plurality of integrated devices may be coupled to the carrier 800 through one or more adhesives. A back side of the integrated device 303*a* is placed and/or coupled to the carrier 800. The integrated device 303*a* may include a plurality of pillar interconnects 331*a*. A back side of the integrated device 303*b* is placed and/or coupled to the carrier 800. The integrated device 303*b* may include a plurality of pillar interconnects 331*b*. The dummy silicon structure 107 may be coupled to the carrier 800. An adhesive may be used to couple the dummy silicon structure 107 to the carrier 800. In some implementations, more than one dummy silicon structure 107 may be provided. The dummy silicon structure 107 may be located laterally between the integrated device 303*a* and the integrated device 303*b*.

Stage 2 of FIG. 8A, illustrates a state after an encapsulation layer 309 is formed and coupled to the carrier 800, the integrated device 303*a*, the integrated device 303*b* and the dummy silicon structure 107. The encapsulation layer 309 may include a mold, a resin, an epoxy and/or a filler. The encapsulation layer 309 may be a means for encapsulation. The encapsulation layer 309 may be provided by using a compression and transfer molding process, a sheet molding process, or a liquid molding process. The encapsulation layer 309 may be over molded. The encapsulation layer 309 may at least partially encapsulate the dummy silicon structure 107, the integrated device 303*a*, the integrated device 303*b*, the plurality of pillar interconnects 331*a* and/or the plurality of pillar interconnects 331*b*.

Stage 3 of FIG. 8A, illustrates a state after portions of the encapsulation layer 309 are removed. A grinding process may be used remove portions of the encapsulation layer 309. In some implementations, portions of pillar interconnects (e.g., 331*a*, 331*b*) and/or part of the dummy silicon structure 107, the integrated device 303*a* and/or the integrated device 303*b* may also be removed.

Figure 8B:
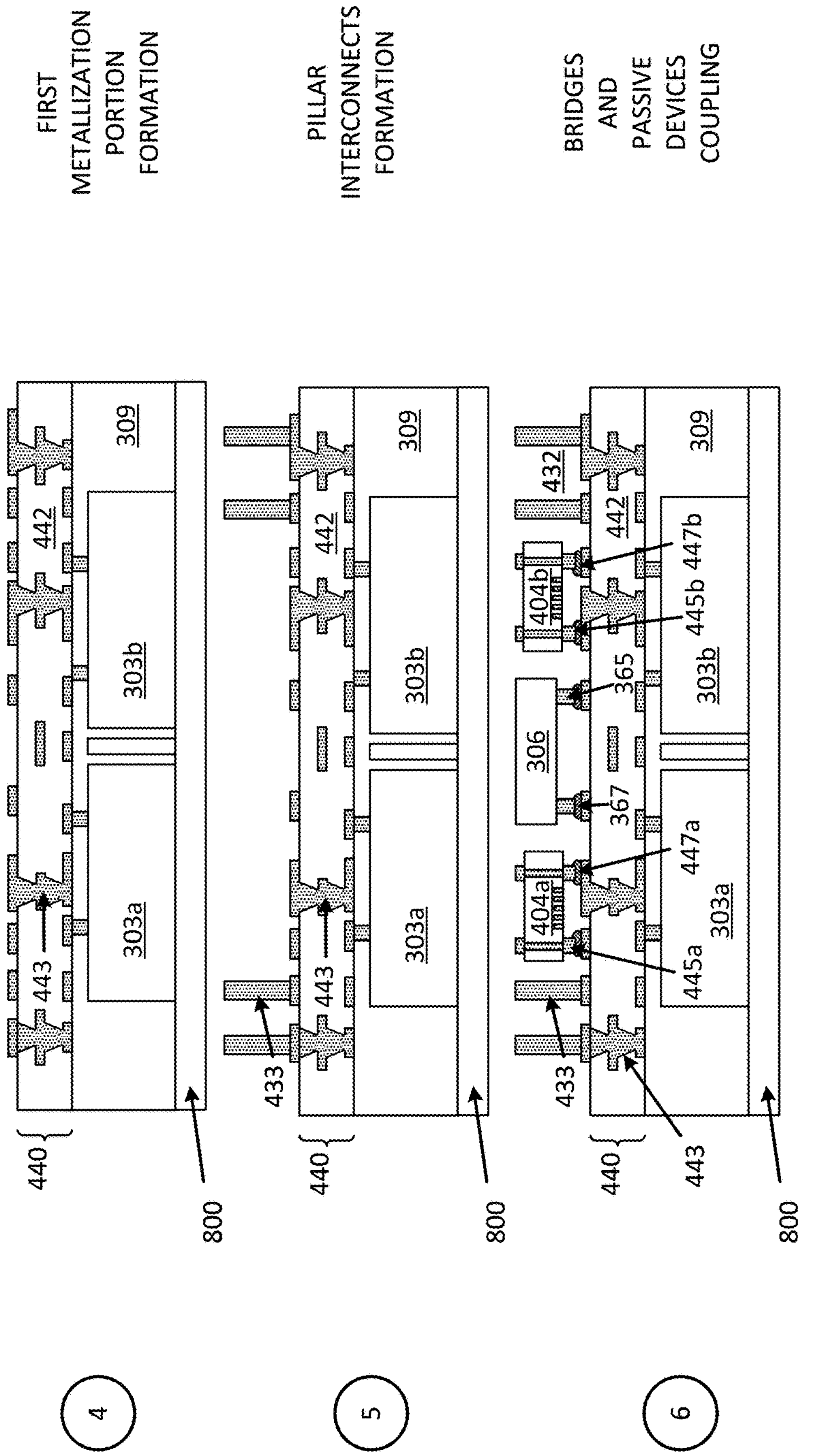

Stage 4 of FIG. 8B, illustrates a state after a metallization portion 440 is formed and coupled to the encapsulation layer 309. The metallization portion 440 includes at least one dielectric layer 442 and a plurality of metallization interconnects 443. In some implementations, the metallization portion 440 may be a first metallization portion. In some implementations, the at least one dielectric layer 442 may be an at least first dielectric layer. In some implementations, the plurality of metallization interconnects 443 may be a first plurality of metallization interconnects. In some implementations, a deposition process, a lamination process, an etching process (e.g., photo etching process), a laser process, an exposure process, a development process, a lithography process, a plating process, and/or a strip process may be used to form the metallization portion 440 comprising the at least one dielectric layer 442 and the plurality of metallization interconnects 443. An example of forming a metallization portion is illustrated and described below in at least FIGS. 10A-10B.

Stage 5 of FIG. 8B, illustrates a state after a plurality of post interconnects 433 are formed and coupled to the metallization portion 440. The plurality of post interconnects 433 may be coupled to the plurality of metallization interconnects 443. A lithography process, a plating process, a strip process and/or an etching process may be used to form the plurality of post interconnects 433.

Stage 6 of FIG. 8B, illustrates a state after a bridge 306 is coupled to the metallization portion 440. A front side of the bridge 306 is coupled to the metallization portion 440 through a plurality of post interconnects 365 and/or a plurality of solder interconnects 367. A bridge may include a front side and a back side. The back side of a bridge (e.g., silicon bridge) may be a side that includes a bridge substrate (e.g., silicon bridge substrate). The front side of a bridge may be a side that includes a bridge interconnect and/or a bridge dielectric layer. A solder reflow process may be used to couple the bridge 306 to the metallization portion 440.

Stage 6 of FIG. 8B, also illustrates a state after a passive device 404*a* and a passive device 404*b* are coupled to the metallization portion 440. A front side of the passive device 404*a* may be coupled to metallization portion 440 through a plurality of post interconnects 445*a* and/or a plurality of solder interconnects 447*a*. A front side of the passive device 404*b* may be coupled to metallization portion 440 through a plurality of post interconnects 445*b* and/or a plurality of solder interconnects 447*b*. A solder reflow process may be used to couple the passive device 404*a* and/or the passive device 404*b* to the metallization portion 440.

Figure 8C:
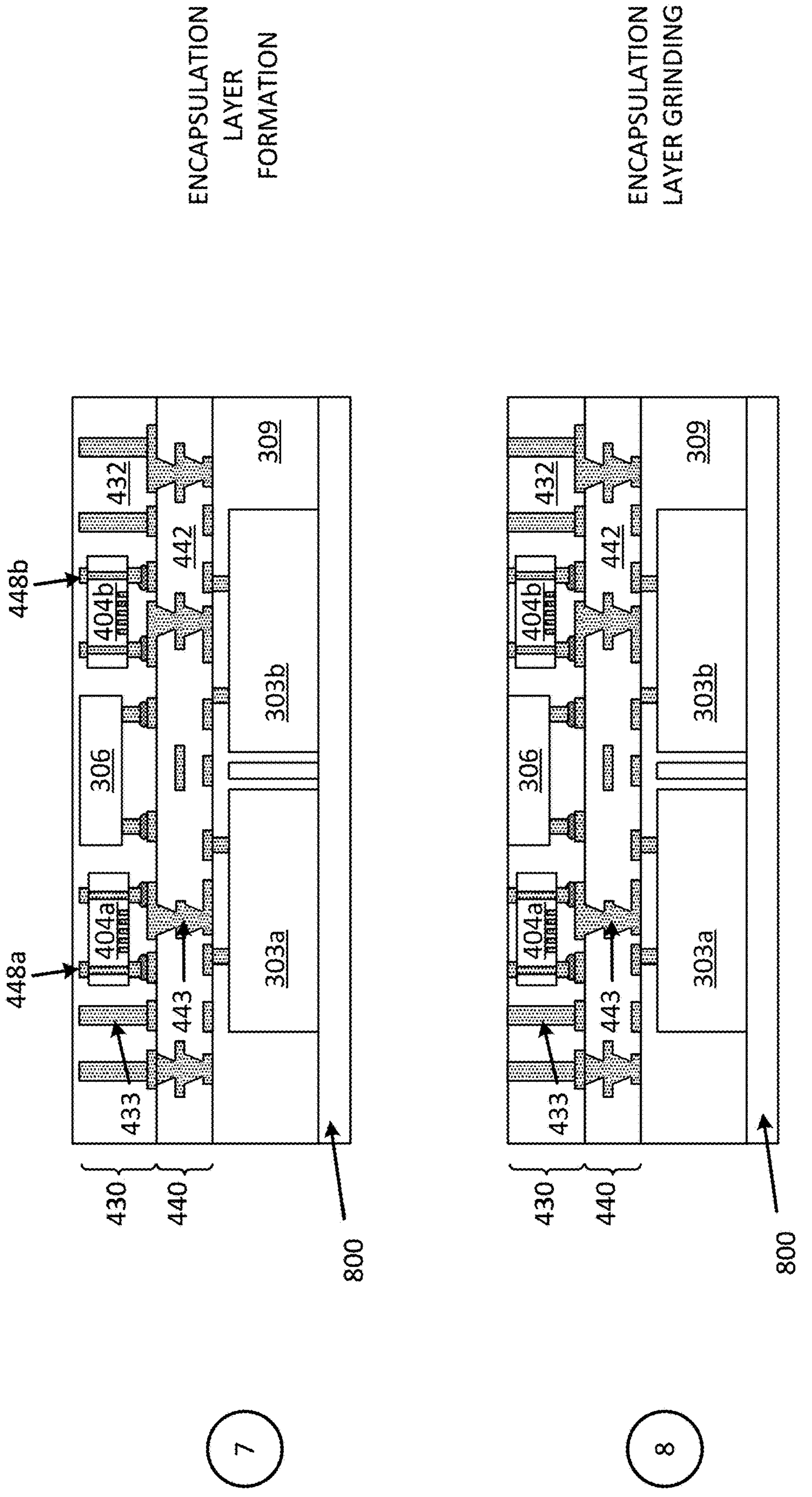

Stage 7 of FIG. 8C, illustrates a state after an encapsulation layer 432 is formed and coupled to the metallization portion 440. The encapsulation layer 432 may be a second encapsulation layer. The encapsulation layer 432 may include a mold, a resin, an epoxy and/or a filler. The encapsulation layer 432 may be a means for encapsulation. The encapsulation layer 432 may be provided by using a compression and transfer molding process, a sheet molding process, or a liquid molding process. The encapsulation layer 432 may at least partially encapsulate the plurality of post interconnects 433, the bridge 306, the passive device 404*a* and/or the passive device 404*b*. The encapsulation layer 432 may be over molded. The encapsulation layer 432 may at least partially encapsulate the plurality of post interconnects 365, the plurality of interconnects 448*a* (e.g., post interconnects), the plurality of interconnects 448*b* (e.g., post interconnects), the plurality of solder interconnects 367, the plurality of solder interconnects 447*a* and/or, the plurality of solder interconnects 447*b*.

Stage 8 of FIG. 8C, illustrates a state a portion of the encapsulation layer 432 is removed. The encapsulation layer 432 may be grinded to form an encapsulation layer 432 with a planar surface. Portions of the plurality of post interconnects 433 and/or other post interconnects (e.g., 448*a*, 448*b*) may also be removed. Stage 8 may illustrate an encapsulated portion 430 that includes an encapsulation layer 432, a plurality of post interconnects 433, at least one bridge and at least one passive device. Stage 8 of FIG. 8C, illustrates an encapsulated portion 430 that is coupled to the metallization portion 440.

Figure 8D:
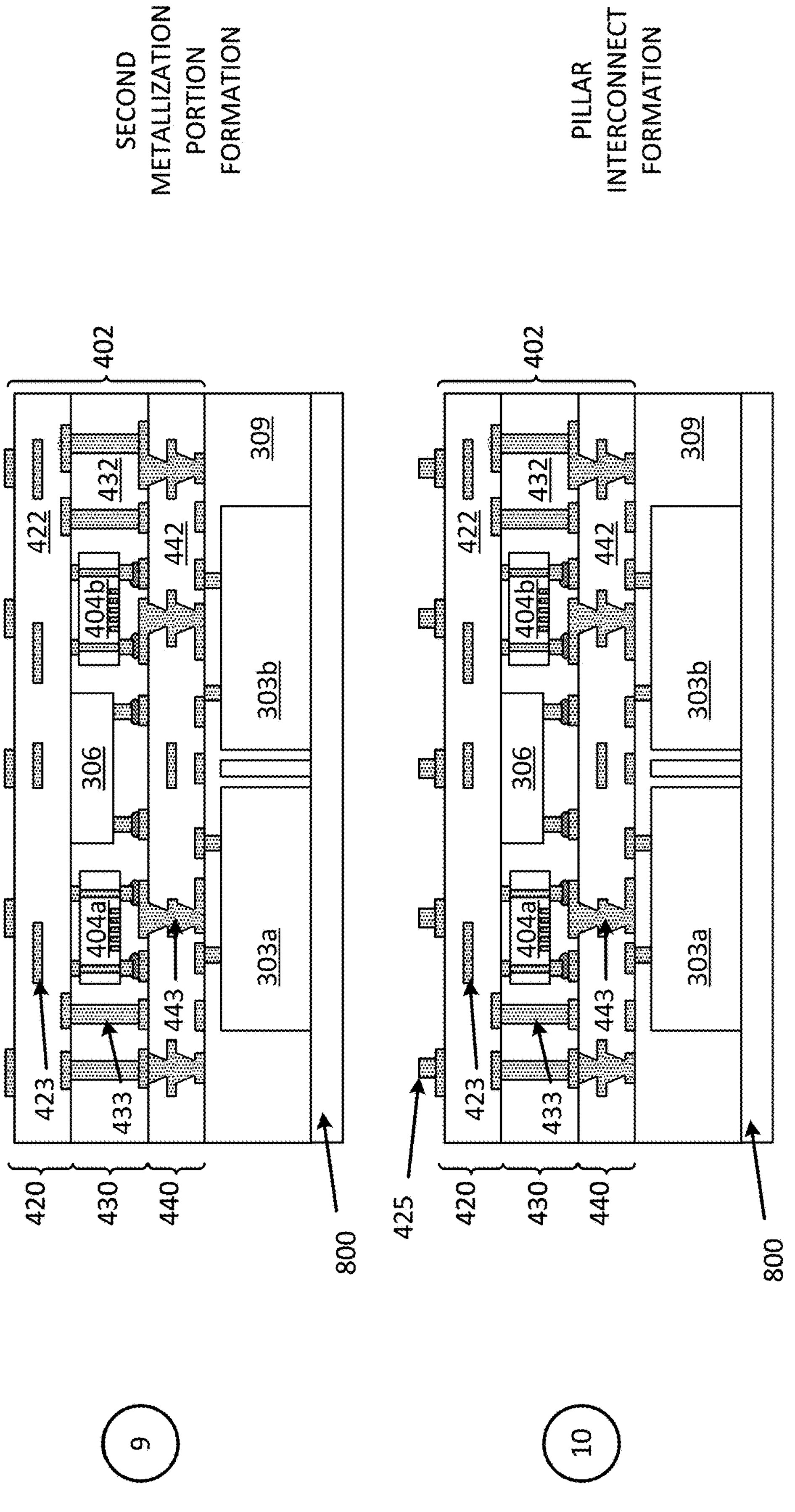

Stage 9 of FIG. 8D, illustrates a state after a metallization portion 420 is formed over and coupled to the encapsulated portion 430. The metallization portion 420 may be formed over the encapsulation layer 432. The metallization portion 420 includes at least one dielectric layer 422 and a plurality of metallization interconnects 423. In some implementations, the metallization portion 420 may be a second metallization portion. In some implementations, the at least one dielectric layer 422 may be an at least second dielectric layer. In some implementations, the plurality of metallization interconnects 423 may be a second plurality of metallization interconnects. The plurality of metallization interconnects 423 may be coupled to and touch, the plurality of post interconnects 433 and/or other post interconnects (e.g., 448*a*, 448*b*) in the encapsulation layer 432. In some implementations, a deposition process, a lamination process, an etching process (e.g., photo etching process), a laser process, an exposure process, a development process, a lithography process, a plating process, and/or a strip process may be used to form the metallization portion 420 comprising the at least one dielectric layer 422 and the plurality of metallization interconnects 423. Stage 9 may illustrate a package interposer 402 that includes the metallization portion 420, the encapsulated portion 430 and the metallization portion 440. The encapsulated portion 430 may be located between the metallization portion 420 and the metallization portion 440. An example of forming a metallization portion is illustrated and described below in at least FIGS. 10A-10B.

Stage 10 of FIG. 8D, illustrates a state after a plurality of pillar interconnects 425 are formed and coupled to the metallization portion 420. The plurality of pillar interconnects 425 may be coupled to the plurality of metallization interconnects 423. A lithography process, a plating process, a strip process and/or an etching process may be used to form the plurality of pillar interconnects 425. The plurality of pillar interconnects 425 may be optional. In some implementations, the metallization portion 420 may be optional.

In such instances, the plurality of pillar interconnects 425 may be formed and coupled to the plurality of post interconnects 433.

Figure 8E:
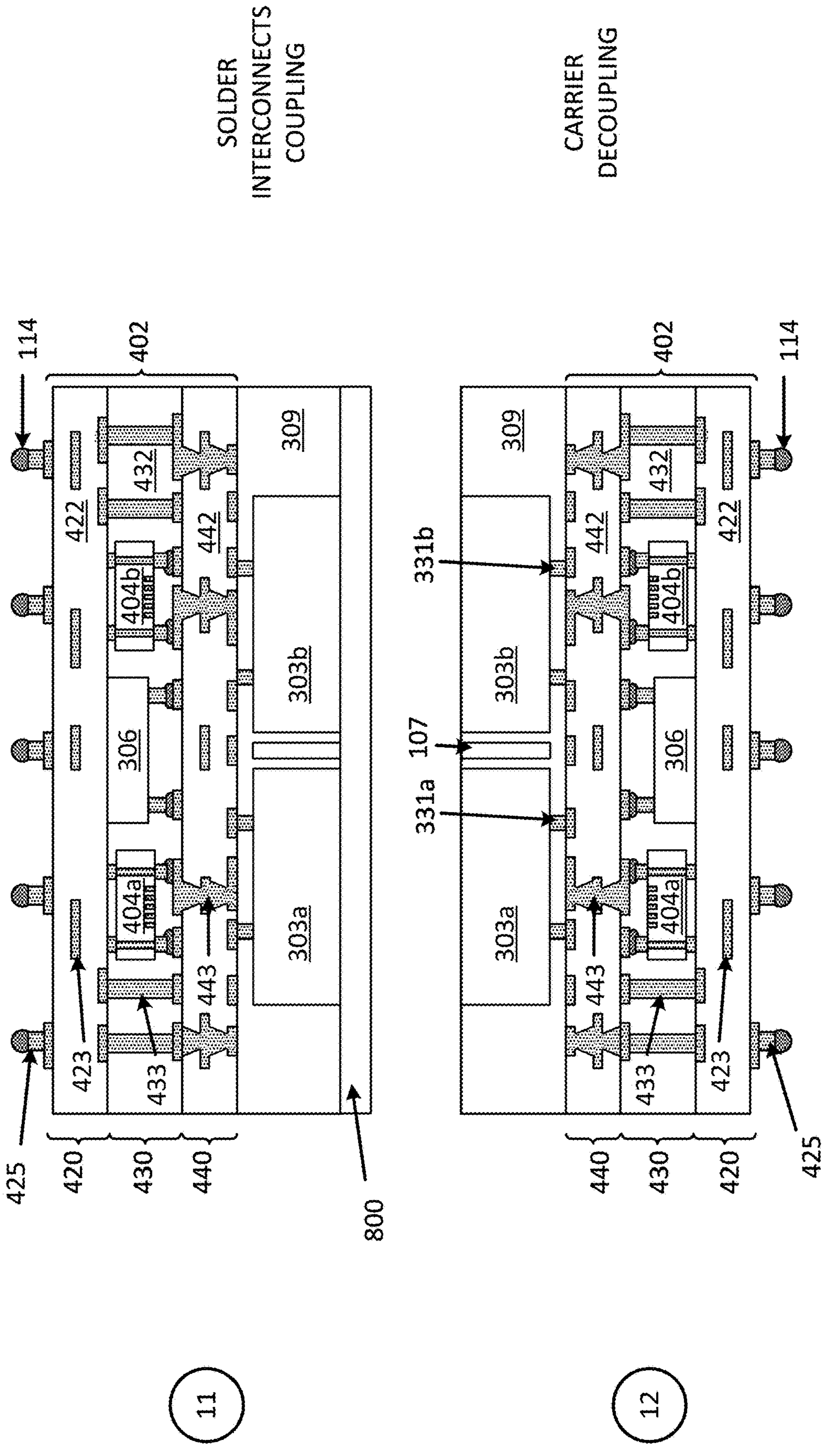

Stage 11 of FIG. 8E, illustrates a state after a plurality of solder interconnects 114 are coupled to the plurality of pillar interconnects 425. A solder reflow process may be used to couple the plurality of pillar interconnects 425. In some implementations, the plurality of solder interconnects 114 may be coupled to the plurality of metallization interconnects 423.

Stage 12 of FIG. 8E, illustrates a state after the package interposer 402 is decoupled from the carrier 800. The package interposer 402 may be detached from the carrier 800. Stage 12 of FIG. 8E may illustrate a package 400.

Different implementations may use different processes for forming the metal layer(s) and/or interconnects. In some implementations, a chemical vapor deposition (CVD) process, a physical vapor deposition (PVD) process, a sputtering process, a spray coating process, and/or a plating process may be used to form the metal layer(s).

Figure 9:
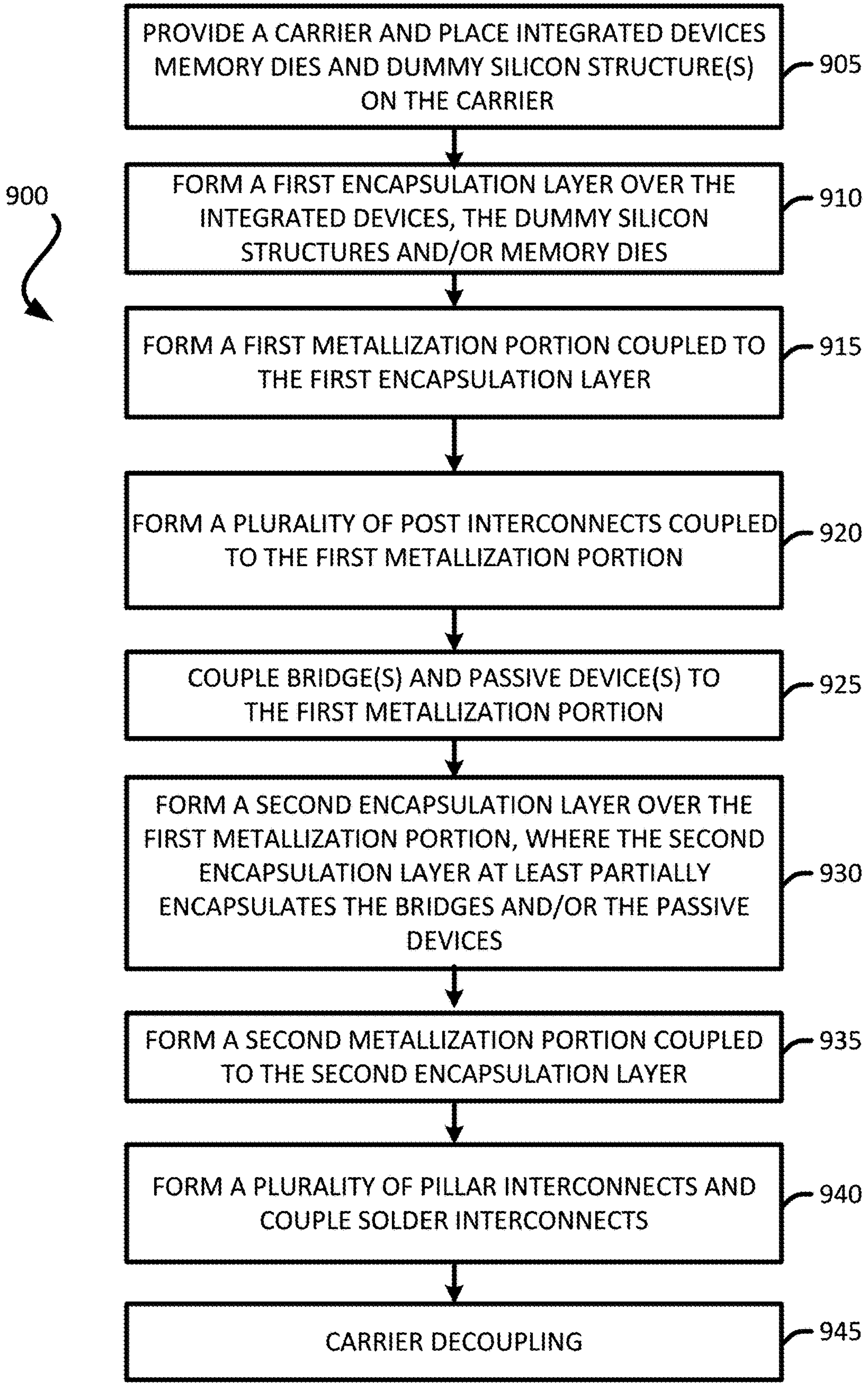
FIG. 9 illustrates an exemplary flow chart of a method for fabricating a package comprising a dummy silicon structure.

Exemplary Flow Diagram of a Method for Fabricating a Package Comprising a Dummy Silicon Structure In some implementations, fabricating a package includes several processes. FIG. 9 illustrates an exemplary flow diagram of a method 900 for providing or fabricating a package. In some implementations, the method 900 of FIG. 9 may be used to provide or fabricate the package 400 described in the disclosure. However, the method 900 may be used to provide or fabricate any of the packages (e.g., 100) described in the disclosure.

It should be noted that the method 900 of FIG. 9 may combine one or more processes in order to simplify and/or clarify the method for providing or fabricating a package. In some implementations, the order of the processes may be changed or modified.

The method provides (at 905) a carrier and places (at 905) integrated devices and a dummy silicon structure on the carrier. Stage 1 of FIG. 8A, illustrates and describes an example of a state after a carrier 800 and a plurality of integrated devices is placed on the carrier 800. The plurality of integrated devices may be coupled to the carrier 800 through one or more adhesives. A back side of the integrated device 303*a* is placed and/or coupled to the carrier 800. The integrated device 303*a* may include a plurality of pillar interconnects 331*a*. A back side of the integrated device 303*b* is placed and/or coupled to the carrier 800. The integrated device 303*b* may include a plurality of pillar interconnects 331*b*. The dummy silicon structure 107 may be coupled to the carrier 800. An adhesive may be used to couple the dummy silicon structure 107 to the carrier 800. In some implementations, more than one dummy silicon structure 107 may be provided. The dummy silicon structure 107 may be located laterally between the integrated device 303*a* and the integrated device 303*b*.

The method forms (at 910) a first encapsulation layer over the integrated devices, the dummy silicon structure and/or the memory dies. Stage 2 of FIG. 8A, illustrates and describes an example of a state after an encapsulation layer 309 is formed and coupled to the carrier 800, the integrated device 303*a*, the integrated device 303*b* and the dummy silicon structure 107. The encapsulation layer 309 may include a mold, a resin, an epoxy and/or a filler. The encapsulation layer 309 may be a means for encapsulation. The encapsulation layer 309 may be provided by using a compression and transfer molding process, a sheet molding process, or a liquid molding process. The encapsulation layer 309 may be over molded. The encapsulation layer 309 may at least partially encapsulate the dummy silicon structure 107, the integrated device 303*a*, the integrated device 303*b*, the plurality of pillar interconnects 331*a* and/or the plurality of pillar interconnects 331*b*. Forming an encapsulation layer may include removing portions of the encapsulation layer. Stage 3 of FIG. 8A, illustrates and describes an example of a state after portions of the encapsulation layer 309 are removed. A grinding process may be used remove portions of the encapsulation layer 309. In some implementations, portions of pillar interconnects (e.g., 331*a*, 331*b*) and/or part of the dummy silicon structure 107, the integrated device 303*a* and/or the integrated device 303*b* may also be removed.

The method forms (at 915) a first metallization portion coupled to the encapsulation layer. Stage 4 of FIG. 8B, illustrates and describes an example of a state after a metallization portion 440 is formed and coupled to the encapsulation layer 309. The metallization portion 440 includes at least one dielectric layer 442 and a plurality of metallization interconnects 443. In some implementations, the metallization portion 440 may be a first metallization portion. In some implementations, the at least one dielectric layer 442 may be an at least first dielectric layer. In some implementations, the plurality of metallization interconnects 443 may be a first plurality of metallization interconnects. In some implementations, a deposition process, a lamination process, an etching process (e.g., photo etching process), a laser process, an exposure process, a development process, a lithography process, a plating process, and/or a strip process may be used to form the metallization portion 440 comprising the at least one dielectric layer 442 and the plurality of metallization interconnects 443. An example of forming a metallization portion is illustrated and described below in at least FIGS. 10A-10B.

The method forms (at 920) a plurality of post interconnects that are coupled to the first metallization portion. Stage 5 of FIG. 8B, illustrates and describes an example of a state after a plurality of post interconnects 433 are formed and coupled to the metallization portion 440. The plurality of post interconnects 433 may be coupled to the plurality of metallization interconnects 443. A lithography process, a plating process, a strip process and/or an etching process may be used to form the plurality of post interconnects 433.

The method couples (at 925) a bridge and passive devices to the first metallization portion. Stage 6 of FIG. 8B, illustrates and describes an example of a state after a bridge 306 is coupled to the metallization portion 440. A front side of the bridge 306 is coupled to the metallization portion 440 through a plurality of post interconnects 365 and/or a plurality of solder interconnects 367. A bridge may include a front side and a back side. The back side of a bridge (e.g., silicon bridge) may be a side that includes a bridge substrate (e.g., silicon bridge substrate). The front side of a bridge may be a side that includes a bridge interconnect and/or a bridge dielectric layer. A solder reflow process may be used to couple the bridge 306 to the metallization portion 440.

Stage 6 of FIG. 8B, also illustrates and describes an example of a state after a passive device 404*a* and a passive device 404*b* are coupled to the metallization portion 440. A front side of the passive device 404*a* may be coupled to metallization portion 440 through a plurality of post interconnects 445*a* and/or a plurality of solder interconnects 447*a*. A front side of the passive device 404*b* may be coupled to metallization portion 440 through a plurality of post interconnects 445*b* and/or a plurality of solder interconnects 447*b*. A solder reflow process may be used to couple the passive device 404*a* and/or the passive device 404*b* to the metallization portion 440.

The method forms (at 930) a second encapsulation layer over the first metallization portion. Stage 7 of FIG. 8C, illustrates and describes an example of a state after an encapsulation layer 432 is formed and coupled to the metallization portion 440. The encapsulation layer 432 may be a second encapsulation layer. The encapsulation layer 432 may include a mold, a resin, an epoxy and/or a filler. The encapsulation layer 432 may be a means for encapsulation. The encapsulation layer 432 may be provided by using a compression and transfer molding process, a sheet molding process, or a liquid molding process. The encapsulation layer 432 may at least partially encapsulate the plurality of post interconnects 433, the bridge 306, the passive device 404*a* and/or the passive device 404*b*. The encapsulation layer 432 may be over molded. The encapsulation layer 432 may at least partially encapsulate the plurality of post interconnects 365, the plurality of interconnects 448*a* (e.g., post interconnects), the plurality of interconnects 448*b* (e.g., post interconnects), the plurality of solder interconnects 367, the plurality of solder interconnects 447*a* and/or, the plurality of solder interconnects 447*b*. Forming the encapsulation layer may include removing portions of an encapsulation layer. Stage 8 of FIG. 8C, illustrates and describes an example of a state a portion of the encapsulation layer 432 is removed. The encapsulation layer 432 may be grinded to form an encapsulation layer 432 with a planar surface. Portions of the plurality of post interconnects 433 and/or other post interconnects (e.g., 448*a*, 448*b*) may also be removed. Stage 8 may illustrate an encapsulated portion 430 that includes an encapsulation layer 432, a plurality of post interconnects 433, at least one bridge and at least one passive device. Stage 8 of FIG. 8C, illustrates an encapsulated portion 430 that is coupled to the metallization portion 440.

The method forms (at 935) a second metallization portion that is coupled to the encapsulated portion. Stage 9 of FIG. 8D, illustrates and describes an example of a state after a metallization portion 420 is formed over and coupled to the encapsulated portion 430. The metallization portion 420 may be formed over the encapsulation layer 432. The metallization portion 420 includes at least one dielectric layer 422 and a plurality of metallization interconnects 423. In some implementations, the metallization portion 420 may be a second metallization portion. In some implementations, the at least one dielectric layer 422 may be an at least second dielectric layer. In some implementations, the plurality of metallization interconnects 423 may be a second plurality of metallization interconnects. The plurality of metallization interconnects 423 may be coupled to and touch, the plurality of post interconnects 433 and/or other post interconnects (e.g., 448*a*, 448*b*) in the encapsulation layer 432. In some implementations, a deposition process, a lamination process, an etching process (e.g., photo etching process), a laser process, an exposure process, a development process, a lithography process, a plating process, and/or a strip process may be used to form the metallization portion 420 comprising the at least one dielectric layer 422 and the plurality of metallization interconnects 423. Stage 9 may illustrate a package interposer 402 that includes the metallization portion 420, the encapsulated portion 430 and the metallization portion 440. The encapsulated portion 430 may be located between the metallization portion 420 and the metallization portion 440.

An example of forming a metallization portion is illustrated and described below in at least FIGS. 10A-10B.

The method forms (at 940) a plurality of pillar interconnects and/or a plurality of solder interconnects. Stage 10 of FIG. 8D, illustrates and describes an example of a state after a plurality of pillar interconnects 425 are formed and coupled to the metallization portion 420. The plurality of pillar interconnects 425 may be coupled to the plurality of metallization interconnects 423. A lithography process, a plating process, a strip process and/or an etching process may be used to form the plurality of pillar interconnects 425. The plurality of pillar interconnects 425 may be optional. In some implementations, the metallization portion 420 may be optional. In such instances, the plurality of pillar interconnects 425 may be formed and coupled to the plurality of post interconnects 433. Stage 11 of FIG. 8E, illustrates and describes an example of a state after a plurality of solder interconnects 114 are coupled to the plurality of pillar interconnects 425. A solder reflow process may be used to couple the plurality of pillar interconnects 425. In some implementations, the plurality of solder interconnects 114 may be coupled to the plurality of metallization interconnects 423.

The method decouples (at 945) a carrier from the package interposer. Stage 12 of FIG. 8E, illustrates and describes an example of a state after the package interposer 402 is decoupled from the carrier 800. The package interposer 402 may be detached from the carrier 800. Stage 12 of FIG. 8E may illustrate a package 400.

Exemplary Sequence for Fabricating a Metallization Portion

In some implementations, fabricating a substrate includes several processes. FIGS. 10A-10B illustrate an exemplary sequence for providing or fabricating a metallization portion. In some implementations, the sequence of FIGS. 10A-10B may be used to provide or fabricate the metallization portion 102. However, the process of FIGS. 10A-10B may be used to fabricate any of the metallization portions described in the disclosure.

Figure 10A:
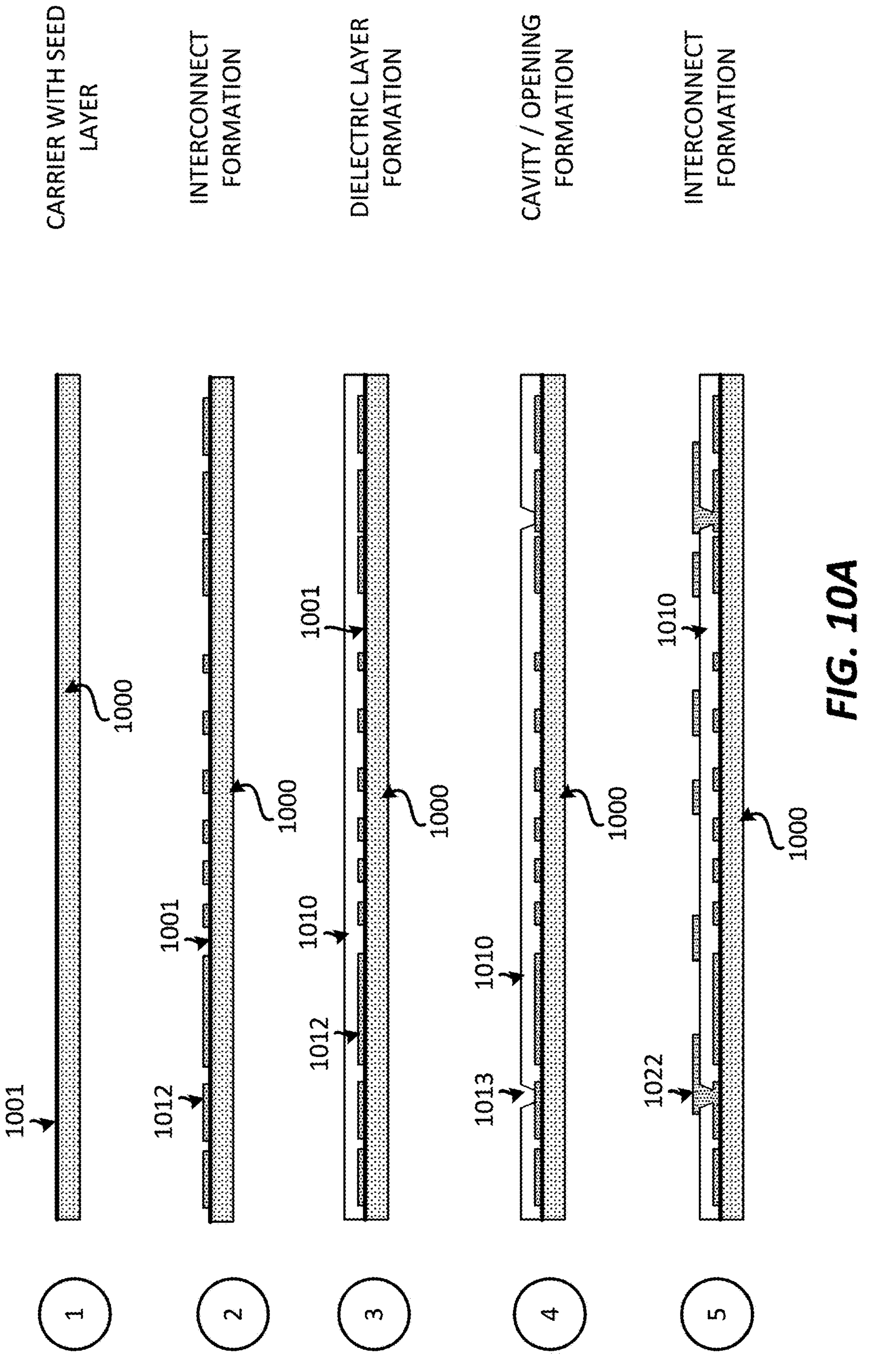
FIGS. 10A-10B illustrate an exemplary sequence for fabricating a metallization portion.
Figure 10B:
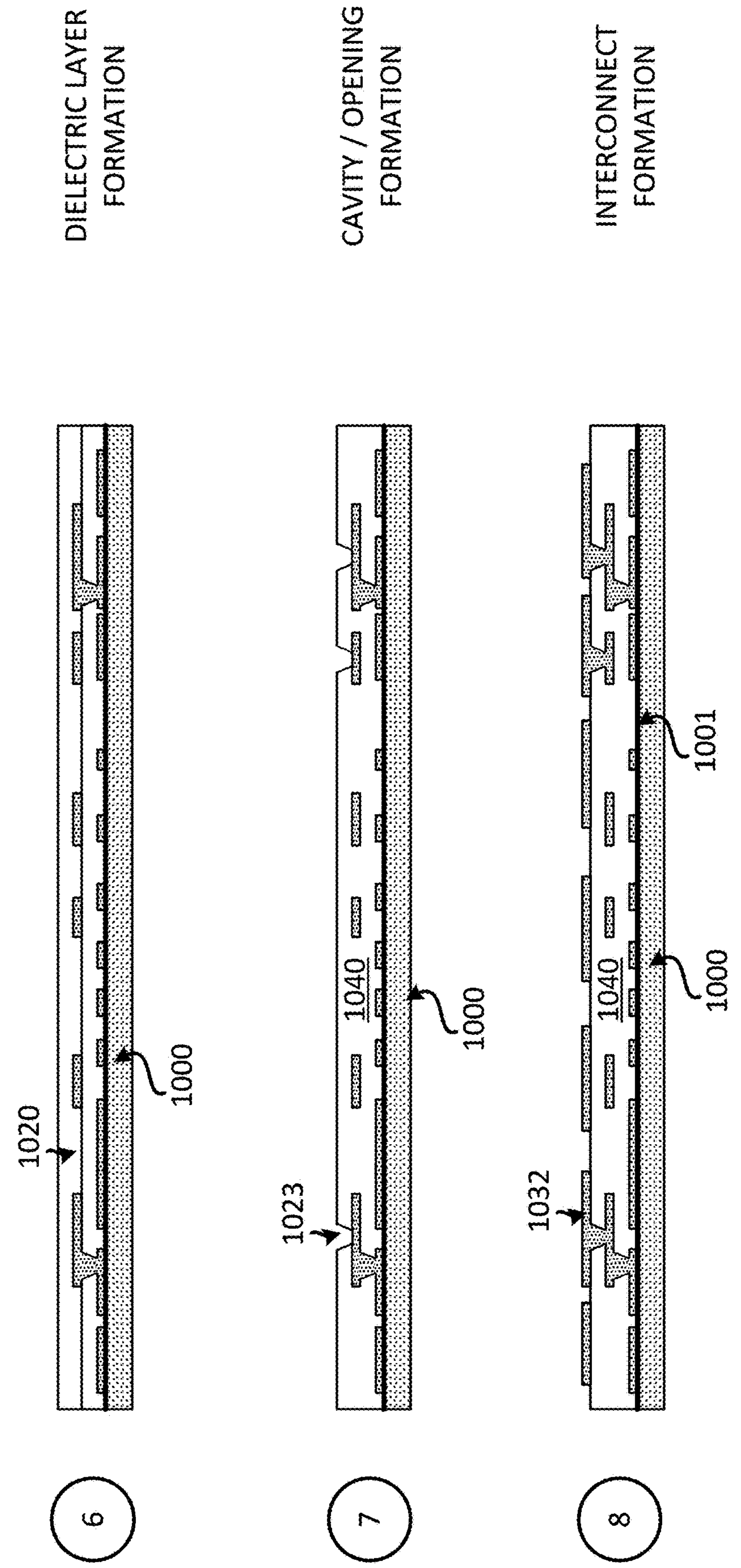

It should be noted that the sequence of FIGS. 10A-10B may combine one or more stages in order to simplify and/or clarify the sequence for providing or fabricating a metallization portion. In some implementations, the order of the processes may be changed or modified. In some implementations, one or more of processes may be replaced or substituted without departing from the scope of the disclosure.

Stage 1, as shown in FIG. 10A, illustrates a state after a carrier 1000 is provided. A seed layer 1001 may be located over the carrier 1000. The carrier 1000 may be replaced with other components and/or materials.

Stage 2 illustrates a state after a plurality of interconnects 1012 are formed. The interconnects 1012 may be located over the seed layer 1001. A lithography process, a plating process, a strip process and/or an etching process may be used to form the plurality of interconnects 1012. The interconnects 1012 may represent at least some of the interconnects from the plurality of metallization interconnects 123.

Stage 3 illustrates a state after a dielectric layer 1010 is formed over the carrier 1000, the seed layer 1001 and the plurality of interconnects 1012. A deposition and/or lamination process may be used to form the dielectric layer 1010. The dielectric layer 1010 may include prepreg and/or polyimide. The dielectric layer 1010 may include a photo-imageable dielectric. However, different implementations may use different materials for the dielectric layer.

Stage 4 illustrates a state after a plurality of cavities 1013 is formed in the dielectric layer 1010. The plurality of cavities 1013 may be formed using an etching process (e.g., photo etching process), a laser process, an exposure process and/or a development process.

Stage 5 illustrates a state after interconnects 1022 are formed in and over the dielectric layer 1010, including in and over the plurality of cavities 1013. For example, a via, pad and/or traces may be formed. A lithography process, a plating process, a strip process and/or an etching process may be used to form the interconnects.

Stage 6, as shown in FIG. 10B, illustrates a state after a dielectric layer 1020 is formed over the dielectric layer 1010 and the plurality of interconnects 1022. A deposition and/or lamination process may be used to form the dielectric layer 1020. The dielectric layer 1020 may include prepreg and/or polyimide. The dielectric layer 1020 may include a photo-imageable dielectric. However, different implementations may use different materials for the dielectric layer.

Stage 7, illustrates a state after a plurality of cavities 1023 is formed in the dielectric layer 1040. The dielectric layer 1040 may represent the dielectric layer 1010 and/or the dielectric layer 1020. The plurality of cavities 1023 may be formed using an etching process (e.g., photo etching process), a laser process, an exposure process and/or a development process.

Stage 8 illustrates a state after interconnects 1032 are formed in and over the dielectric layer 1040, including in and over the plurality of cavities 1023. For example, a via, pad and/or traces may be formed. A lithography process, a plating process, a strip process and/or an etching process may be used to form the interconnects.

Different implementations may use different processes for forming the metal layer(s) and/or interconnects. In some implementations, a chemical vapor deposition (CVD) process, a physical vapor deposition (PVD) process, a sputtering process, a spray coating process, and/or a plating process may be used to form the metal layer(s).

Exemplary Flow Diagram of a Method for Fabricating a Metallization Portion

Figure 11:
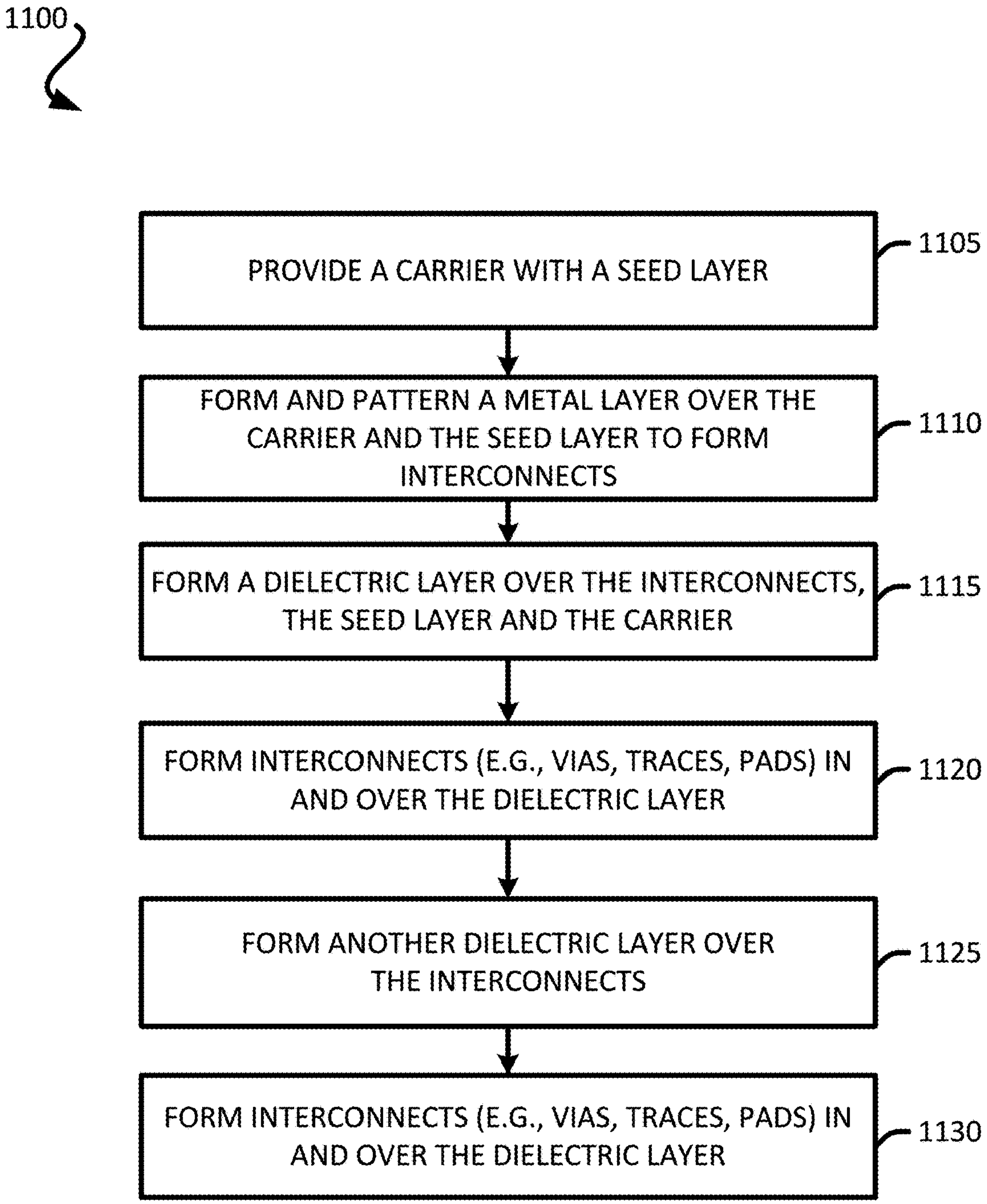
FIG. 11 illustrates an exemplary flow chart of a method for fabricating a metallization portion.

In some implementations, fabricating a substrate includes several processes. FIG. 11 illustrates an exemplary flow diagram of a method 1100 for providing or fabricating a metallization portion. In some implementations, the method 1100 of FIG. 11 may be used to provide or fabricate the metallization portion(s) of the disclosure. For example, the method 1100 of FIG. 11 may be used to fabricate the metallization portion 102.

It should be noted that the method 1100 of FIG. 11 may combine one or more processes in order to simplify and/or clarify the method for providing or fabricating a metallization portion. In some implementations, the order of the processes may be changed or modified.

The method provides (at 1105) a carrier with a seed layer. Stage 1 of FIG. 10A, illustrates and describes an example of a state after a carrier 1000 is provided. A seed layer 1001 may be located over the carrier 1000. The carrier 1000 may be replaced with other components and/or materials.

The method forms and patterns (at 1110) a plurality of interconnects. Stage 2 of FIG. 10A, illustrates and describes an example of a state after a plurality of interconnects 1012 are formed. The interconnects 1012 may be located over the seed layer 1001. A lithography process, a plating process, a strip process and/or an etching process may be used to form the plurality of interconnects 1012. The interconnects 1012 may represent at least some of the interconnects from the plurality of metallization interconnects 123.

The method forms (at 1110) a dielectric layer. Stage 3 of FIG. 10A, illustrates and describes an example of a state after a dielectric layer 1010 is formed over the carrier 1000, the seed layer 1001 and the plurality of interconnects 1012. A deposition and/or lamination process may be used to form the dielectric layer 1010. The dielectric layer 1010 may include prepreg and/or polyimide. The dielectric layer 1010 may include a photo-imageable dielectric. However, different implementations may use different materials for the dielectric layer.

The method forms (at 1120) a plurality of interconnects. Forming a plurality of interconnects may including forming a plurality of cavities in a dielectric layer and a performing a plating process. Stage 4 of FIG. 10A, illustrates and describes an example of a state after a plurality of cavities 1013 is formed in the dielectric layer 1010. The plurality of cavities 1013 may be formed using an etching process (e.g., photo etching process), a laser process, an exposure process and/or a development process.

Stage 5 of FIG. 10A, illustrates and describes an example of a state after interconnects 1022 are formed in and over the dielectric layer 1010, including in and over the plurality of cavities 1013. For example, a via, pad and/or traces may be formed. A lithography process, a plating process, a strip process and/or an etching process may be used to form the interconnects.

The method forms (at 1125) another dielectric layer. Stage 6 of FIG. 10B, illustrates and describes an example of a state after a dielectric layer 1020 is formed over the dielectric layer 1010 and the plurality of interconnects 1022. A deposition and/or lamination process may be used to form the dielectric layer 1020. The dielectric layer 1020 may include prepreg and/or polyimide. The dielectric layer 1020 may include a photo-imageable dielectric. However, different implementations may use different materials for the dielectric layer.

The method forms (at 1130) a plurality of interconnects. Forming a plurality of interconnects may including forming a plurality of cavities in a dielectric layer and a performing a plating process. Stage 7 of FIG. 10B, illustrates and describes an example of a state after a plurality of cavities 1023 is formed in the dielectric layer 1040. The dielectric layer 1040 may represent the dielectric layer 1010 and/or the dielectric layer 1020. The plurality of cavities 1023 may be formed using an etching process (e.g., photo etching process), a laser process, an exposure process and/or a development process.

Stage 8 of FIG. 10B, illustrates and describes an example of a state after interconnects 1032 are formed in and over the dielectric layer 1040, including in and over the plurality of cavities 1023. For example, a via, pad and/or traces may be formed. A lithography process, a plating process, a strip process and/or an etching process may be used to form the interconnects.

Different implementations may use different processes for forming the metal layer(s) and/or interconnects. In some implementations, a chemical vapor deposition (CVD) process, a physical vapor deposition (PVD) process, a sputtering process, a spray coating process, and/or a plating process may be used to form the metal layer(s).

Exemplary Electronic Devices

Figure 12:
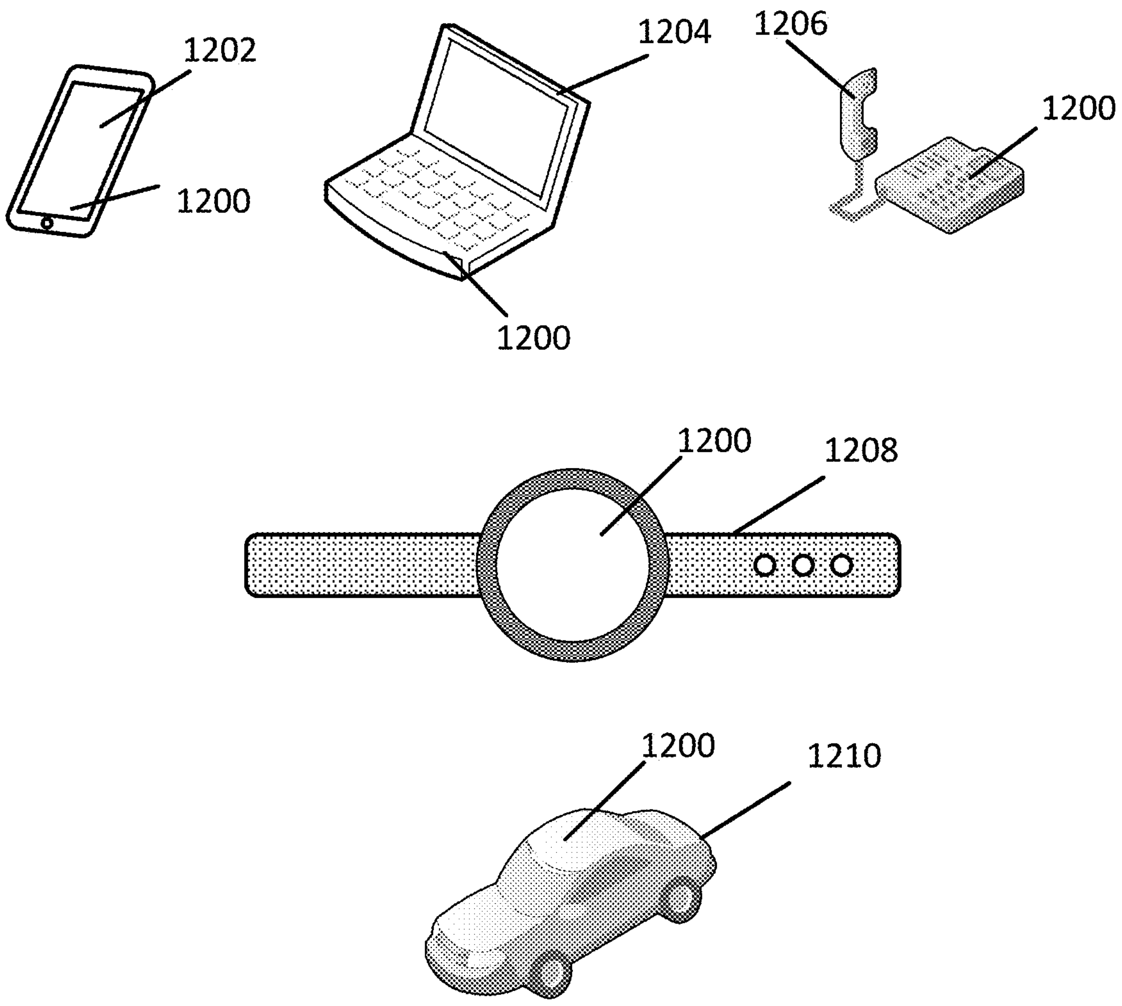
FIG. 12 illustrates various electronic devices that may integrate a die, an electronic circuit, an integrated device, an integrated passive device (IPD), a passive component, a package, and/or a device package described herein.

FIG. 12 illustrates various electronic devices that may be integrated with any of the aforementioned device, integrated device, integrated circuit (IC) package, integrated circuit (IC) device, semiconductor device, integrated circuit, die, interposer, package, package-on-package (POP), System in Package (SiP), or System on Chip (SoC). For example, a mobile phone device 1202, a laptop computer device 1204, a fixed location terminal device 1206, a wearable device 1208, or automotive vehicle 1210 may include a device 1200 as described herein. The device 1200 may be, for example, any of the devices and/or integrated circuit (IC) packages described herein. The devices 1202, 1204, 1206 and 1208 and the vehicle 1210 illustrated in FIG. 12 are merely exemplary. Other electronic devices may also feature the device 1200 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IOT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 1-5, 6A-6E, 7, 8A-8E, 9, 10A-10B and 11-12 may be rearranged and/or combined into a single component, process, feature or function or embodied in several components, processes, or functions. Additional elements, components, processes, and/or functions may also be added without departing from the disclosure. It should also be noted FIGS. 1-5, 6A-6E, 7, 8A-8E, 9, 10A-10B and 11-12 and its corresponding description in the present disclosure is not limited to dies and/or ICs. In some implementations, FIGS. 1-5, 6A-6E, 7, 8A-8E, 9, 10A-10B and 11-12 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (POP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another-even if they do not directly physically touch each other. An object A, that is coupled to an object B, may be coupled to at least part of object B. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The terms "encapsulate", "encapsulating" and/or any derivation means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. A value that is about X-XX, may mean a value that is between X and XX, inclusive of X and XX. The value(s) between X and XX may be discrete or continuous. The term "about 'value X'", or "approximately value X", as used in the disclosure means within 10 percent of the 'value X'. For example, a value of about 1 or approximately 1, would mean a value in a range of 0.9-1.1. A "plurality" of components may include all the possible components or only some of the components from all of the possible components. For example, if a device includes ten components, the use of the term "the plurality of components" may refer to all ten components or only some of the components from the ten components.

In some implementations, an interconnect is an element or component of a device or package that allows or facilitates an electrical connection between two points, elements and/or components. In some implementations, an interconnect may include a trace (e.g., trace interconnect), a via (e.g., via interconnect), a pad (e.g., pad interconnect), a pillar, a metallization layer, a redistribution layer, and/or an under bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. An interconnect may include one or more metal layers. A seed layer may be considered part of an interconnect. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the invention.

Aspect 1: A package comprising a package interposer; a first integrated device coupled to the package interposer; a second integrated device coupled to the package interposer; a dummy silicon structure located laterally between the first integrated device and the second integrated device; and a second encapsulation layer coupled to the package interposer, wherein the encapsulation layer at least partially encapsulates the first integrated device, the second integrated device and the dummy silicon structure. The package interposer comprises a first metallization portion; a second metallization portion; a first passive device located between the first metallization portion and the second metallization portion; and a first encapsulation layer located between the first metallization portion and the second metallization portion.

Aspect 2: The package of aspect 1, wherein the dummy silicon structure is coupled to the package interposer through an adhesive.

Aspect 3: The package of aspects 1 through 2, wherein the dummy silicon structure is configured to be free of any electrical connection with the first integrated device and/or the second integrated device.

Aspect 4: The package of aspects 1 through 3, wherein the package interposer further comprises a second dummy silicon structure located laterally between the first integrated device and the second integrated.

Aspect 5: The package of aspects 1 through 4, wherein the dummy silicon structure is located adjacent to (i) an edge of the first integrated device comprising a die to die portion, and (ii) an edge of the second integrated device comprising a die to die portion.

Aspect 6: The package of aspects 1 through 5, wherein the first integrated device is coupled to the package interposer through a first plurality of pillar interconnects and/or a first plurality of solder interconnects, and wherein the second integrated device is coupled to the package interposer through a second plurality of pillar interconnects and/or a second plurality of solder interconnects.

Aspect 7: The package of aspects 1 through 6, wherein the first integrated device is coupled to the first metallization portion of the package interposer, and wherein the second integrated device is coupled to the first metallization portion of the package interposer.

Aspect 8: The package of aspects 1 through 6, wherein the first integrated device is coupled to the second metallization portion of the package interposer, and wherein the second integrated device is coupled to the second metallization portion of the package interposer.

Aspect 9: The package of aspects 1 through 8, wherein the first passive device includes a trench capacitor device.

Aspect 10: The package of aspects 1 through 9, wherein the package interposer further comprises a second passive device, wherein the first passive device is configured to be electrically coupled to the first integrated device, and wherein the second passive device is configured to be electrically coupled to the second integrated device.

Aspect 11: The package of aspects 1 through 10, wherein the package interposer further comprises a bridge located between the first metallization portion and the second metallization portion.

Aspect 12: The package of aspect 11, wherein an electrical path between the first integrated device and the second integrated device includes the bridge.

Aspect 13: The package of aspect 11, wherein an electrical path between the first integrated device and the second integrated device includes the bridge and the first metallization portion.

Aspect 14: The package of aspect 11, wherein an electrical path between the first integrated device and the second integrated device includes the bridge and the second metallization portion.

Aspect 15: The package of aspects 1 through 14, wherein the package implemented in a device from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

Aspect 16: A package comprising a substrate; a first integrated device coupled to the substrate; a second integrated device coupled to the substrate; a dummy silicon structure located laterally between the first integrated device and the second integrated device; and an encapsulation layer coupled to the substrate, wherein the encapsulation layer at least partially encapsulates the first integrated device, the second integrated device and the dummy silicon structure.

Aspect 17: The package of aspect 16, wherein the dummy silicon structure is coupled to the substrate through an adhesive.

Aspect 18: The package of aspects 16 through 17, wherein the first integrated device is coupled to the substrate through a first plurality of pillar interconnects and/or a first plurality of solder interconnects, and wherein the second integrated device is coupled to the substrate through a second plurality of pillar interconnects and/or a second plurality of solder interconnects.

Aspect 19: A package comprising a metallization portion; a first integrated device coupled to the metallization portion; a second integrated device coupled to the metallization portion; a dummy silicon structure located laterally between the first integrated device and the second integrated device; and an encapsulation layer coupled to the metallization portion, wherein the encapsulation layer at least partially encapsulates the first integrated device, the second integrated device and the dummy silicon structure.

Aspect 20: The package of aspect 19, wherein the dummy silicon structure touches the metallization portion.

Aspect 21: A device comprising aspects 1 through 20, wherein the device is one of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IOT) device, and a device in an automotive vehicle.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A package comprising:
- a first metallization portion;
- a second metallization portion;
- a first passive device coupled to the second metallization portion;
- a first encapsulation layer located between the first metallization portion and the second metallization portion, wherein the first encapsulation layer comprises a mold, a resin, an epoxy and/or a fille;
- a first integrated device coupled to the first metallization portion;
- a second integrated device coupled to the first metallization portion;
- a dummy silicon structure located laterally between the first integrated device and the second integrated device; and
- a second encapsulation layer coupled to the first metallization portion,
  - wherein the second encapsulation layer touches the first metallization portion, and
  - wherein the second encapsulation layer at least partially encapsulates the first integrated device, the second integrated device and the dummy silicon structure.

2. The package of claim 1, wherein the first encapsulation layer is coupled to and touches (i) the first metallization portion and (ii) the second metallization portion.

3. The package of claim 1, wherein the first encapsulation layer is located vertically between the first metallization portion and the second metallization portion.

4. The package of claim 1, wherein the first passive device comprises a deep trench capacitor device.

5. The package of claim 1,
- wherein the first passive device comprises a front side and a back side, and
- wherein the front side of the first passive device faces in a direction towards the first metallization portion.

6. The package of claim 1, wherein the first passive device vertically overlaps with the first integrated device.

7. The package of claim 1, further comprising a plurality of post interconnects located vertically between the first metallization portion and the second metallization portion.

8. The package of claim 7, wherein the plurality of post interconnects are coupled to and touch the second metallization portion.

9. The package of claim 1, wherein the dummy silicon structure is free of any electrical connection with the first integrated device and/or the second integrated device.

10. The package of claim 1, wherein the first passive device is coupled to the second metallization portion through a plurality of solder interconnects.

11. The package of claim 1,
- wherein the first metallization portion comprises at least one first dielectric layer and a first plurality of metallization interconnects, and
- wherein the second metallization portion comprises at least one second dielectric layer and a second plurality of metallization interconnects.

12. The package of claim 1, wherein the first integrated device has a first thickness, and wherein the dummy silicon structure has a second thickness that is greater than the first thickness of the first integrated device.

13. A package comprising a first metallization portion; a second metallization portion; a first passive device coupled to the second metallization portion; a first encapsulation layer located between the first metallization portion and the second metallization portion; a first integrated device coupled to the first metallization portion, wherein the first integrated device has a first thickness; a second integrated device coupled to the first metallization portion; a dummy silicon structure located laterally between the first integrated device and the second integrated device, wherein the dummy silicon structure has a second thickness that is greater than the first thickness of the first integrated device; and a second encapsulation layer coupled to the first metallization portion, wherein the second encapsulation layer touches the first metallization portion, wherein the second encapsulation layer at least partially encapsulates the first integrated device, the second integrated device and the dummy silicon structure.

14. The package of claim 13, wherein the first encapsulation layer is coupled to and touches (i) the first metallization portion and (ii) the second metallization portion.

15. The package of claim 13, wherein the first encapsulation layer is located vertically between the first metallization portion and the second metallization portion.

16. The package of claim 13, wherein the first passive device comprises a deep trench capacitor device.

17. The package of claim 13, further comprising a plurality of post interconnects located vertically between the first metallization portion and the second metallization portion.

18. The package of claim 17, wherein the plurality of post interconnects are coupled to and touch the second metallization portion.

19. The package of claim 13, wherein the dummy silicon structure is free of any electrical connection with the first integrated device and/or the second integrated device.

* * * * *